(12) United States Patent
Yuzurihara et al.

(10) Patent No.: US 8,704,607 B2
(45) Date of Patent: Apr. 22, 2014

(54) PULSE MODULATED RF POWER CONTROL METHOD AND PULSE MODULATED RF POWER SUPPLY DEVICE

(75) Inventors: Itsuo Yuzurihara, Zama (JP); Yoshihisa Hata, Yokohama (JP)

(73) Assignee: Kyosan Electric Mfg. Co., Ltd., Yokohama-shi (JP)

( * ) Notice: Subject to any disclaimer, the term of this patent is extended or adjusted under 35 U.S.C. 154(b) by 558 days.

(21) Appl. No.: 12/781,431

(22) Filed: May 17, 2010

(65) Prior Publication Data

US 2011/0032047 A1 Feb. 10, 2011

(30) Foreign Application Priority Data

Aug. 7, 2009 (JP) .................................. 2009-184411

(51) Int. Cl.
*H03C 1/00* (2006.01)
(52) U.S. Cl.
USPC ........... 332/149; 332/151; 332/106; 332/108; 439/729; 330/137; 156/345.28
(58) Field of Classification Search
USPC .............. 156/345.28; 439/729; 332/149, 151, 332/106, 108; 330/137
See application file for complete search history.

(56) References Cited

U.S. PATENT DOCUMENTS

| 4,500,563 | A | 2/1985 | Ellenberger et al. |
| 6,472,822 | B1 | 10/2002 | Chen et al. |
| 6,586,887 | B1 | 7/2003 | Oogoshi et al. |
| 7,115,185 | B1 * | 10/2006 | Gonzalez et al. ........ 156/345.44 |
| 7,884,667 | B2 * | 2/2011 | Nam et al. ..................... 330/10 |

FOREIGN PATENT DOCUMENTS

| CN | 1380747 | A | 11/2002 |
| CN | 1423418 | A | 6/2003 |
| CN | 1424867 | A | 6/2003 |
| JP | 07-335560 | A | 12/1995 |
| JP | 08-107077 | A | 4/1996 |
| JP | 2001-032077 | A | 2/2001 |
| JP | 2001-160549 | A | 6/2001 |
| JP | 2001-522509 | A | 11/2001 |
| JP | 2002-500413 | A | 1/2002 |
| JP | 2002-324698 | A | 11/2002 |
| JP | 2002-538618 | A | 11/2002 |

(Continued)

OTHER PUBLICATIONS

Written Opinion from JPO, International Search Authority of PCT/JP2010/053610, date of mailing May 18, 2010.

(Continued)

*Primary Examiner* — Arnold Kinkead
(74) *Attorney, Agent, or Firm* — Westerman, Hattori, Daniels & Adrian, LLP

(57) ABSTRACT

The pulse modulated RF power control method includes an output amplitude control step for controlling amplitude of a pulse output, and a duty control step for controlling a duty ratio of the pulse output. The output amplitude control step performs a constant amplitude control to control an amplitude value of the pulse output so that the amplitude value becomes equal to a set amplitude value. The constant amplitude control according to the output amplitude control, for instance, gives a feedback of the amplitude value of the pulse output outputted by the power control, obtains a difference value between the feedback value and the set amplitude value, and controls the amplitude value of the pulse output so that the difference value becomes zero.

31 Claims, 27 Drawing Sheets

(56) References Cited

FOREIGN PATENT DOCUMENTS

| | | | |
|---|---|---|---|
| JP | 2003-173757 | A | 6/2003 |
| JP | 2003-224966 | A | 8/2003 |
| JP | 2004-006571 | A | 1/2004 |
| JP | 2007-087908 | A | 4/2007 |
| JP | 4065820 | B2 | 3/2008 |
| JP | 2009-071292 | A | 4/2009 |
| JP | 2009-111940 | A | 5/2009 |
| JP | 2009-160491 | A | 7/2009 |
| JP | 2009-301820 | A | 12/2009 |
| KP | 10-2002-0077646 | A | 10/2002 |
| KP | 10-2003-0084546 | A | 11/2003 |
| WO | 98/48073 | A1 | 10/1998 |
| WO | 2007/080797 | A1 | 7/2007 |

OTHER PUBLICATIONS

Notification of Reason for Refusal dated Apr. 7, 2011, issued in corresponding Japanese Patent Application No. 2010-533770.

Notification of Reason for Refusal dated Nov. 1, 2010, issued in corresponding Japanese Patent Application No. 2010-533770.

English Translation of Written Opinion (PCT rule 43 2.1) from JPO, The International Search Authority of International Application No. PCT/JP2010/053610.

Notification of Transmittal of Translation of the International Preliminary Report on Patentability (Form PCT/IB/338) of International Application No. PCT/JP2010/053610 mailed Mar. 22, 2012 with forms PCT/IB/373, PCT/ISA/237 and PCT/IB/326.

Notification of Reasons for Refusal dated Sep. 26, 2011, issued in corresponding Japanese Patent Application No. 2010-533770.

German Office Action dated Nov. 22, 2012, issued in corresponding German Patent Application No. 10 2010 015071.1, with Machine translation (7 pages).

Korean Office Action dated Feb. 28, 2013, issued in corresponding Korean Patent Application No. 10-2011-7023384, with English translation (12 pages).

Chinese Office Action dated Oct. 12, 2013, issued in corresponding Chinese Patent Application No. 201080026414.1 with English translation (16 pages).

* cited by examiner

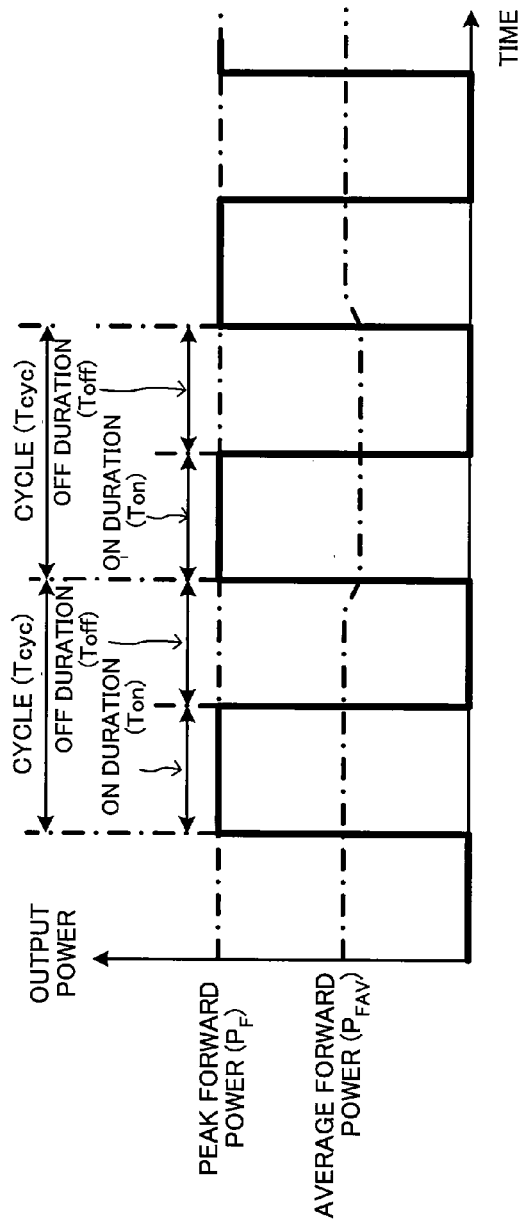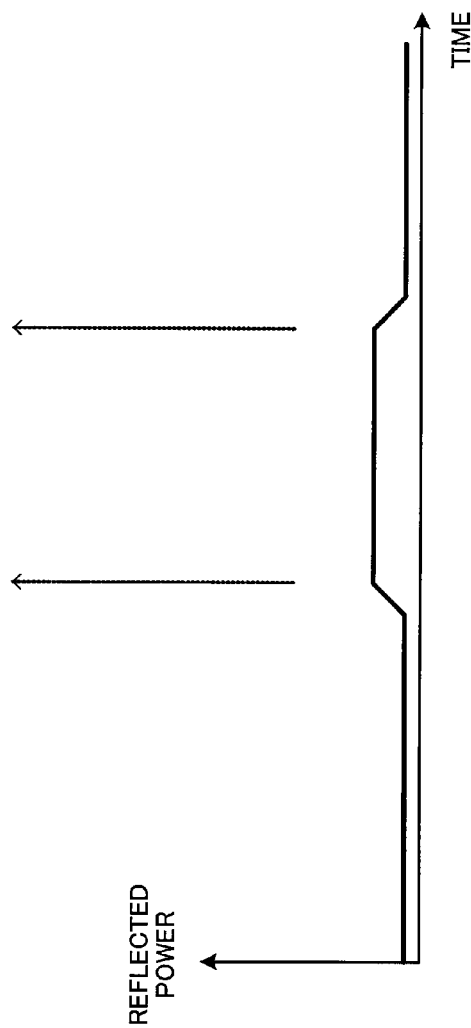
FIG. 2A
FIG. 2B

PULSE MODULATED RF POWER CONTROL METHOD AND PULSE MODULATED RF POWER SUPPLY DEVICE

FIELD OF THE INVENTION

The present invention relates to a radio-frequency (RF) power control method and an RF power supply device, and in particular, it relates to pulse power modulation for modulating power with a pulse-like waveform which is supplied to a load.

DESCRIPTION OF THE RELATED ART

As a method for controlling RF power to be supplied to a load, there are known a method for performing a control to establish constant forward power outputted from the RF power supply device (PF control) and a method for performing a control to establish constant load power which is obtained by subtracting reflected power from the forward power (PL control), as disclosed in the Japanese Unexamined Patent Application Publication No. 2007-087908 (see paragraphs 0002 to 0009, 0026, and 0027) and the Japanese Unexamined Patent Application Publication No. 2009-111940 (see paragraphs 0002 and 0011), which will be referred to as "patent document 1" and "patent document 2", respectively.

As a method for controlling amplitude of outputted power, there are known a continuous power control method for controlling power amplitude of continuous power, and a pulse power control method for changing a duty ratio of a pulse width or a pulse, as disclosed in the Japanese Patent No. 4065820 (see paragraphs 0014 and 0015), which will be referred to as "patent document 3".

In controlling the pulse power or the continuous power, it is known that, in the case where the reflected power is increased, the output power is lowered so as to protect the RF power supply device. In a peak load power control for controlling a peak value of load power, the peak forward power is controlled to be variable, when the peak reflected power fluctuates.

In a conventional power control, when the peak forward power is changed along with the fluctuation of the reflected power, the peak forward power is increased or decreased. Fluctuations of the peak forward power may produce problems, such as rendering output power unstable and affecting a process that is carried out in a chamber on the load side.

By way of example, a matching circuit provided between the RF power source and the load matches the impedance variation caused by the increase or decrease of the peak forward power, by a matching operation. On this occasion, a matching point fluctuates according to this matching operation of the matching circuit. This fluctuation of the matching point destabilizes the impedance in a plasma chamber to process the plasma on the load side, and causes further fluctuations of the reflected power. Consequently, the output power becomes unstable. In addition, when the peak forward power fluctuates, plasma density and plasma atmosphere within the chamber are varied simultaneously, and accordingly, the homogeneity and yield of a process performed in the chamber may be affected adversely.

During the operation of the process performed by the plasma on the load side, if outputting of the forward power is lowered to protect the RF power supply device, in the case where the peak reflected power is increased in the chamber due to a variation of the impedance, there is a problem that lowering of the forward power may cause a loss of plasma activation, interrupt the process development, and affect a product quality.

At the time of process start on the load side, the reflected power is generally apt to become large in the state where the plasma has not been ignited yet. Here, a problem is pointed out that if the output of the forward power is lowered so as to protect the RF power supply device from the increase of the reflected power, ignition of the plasma may become more difficult.

The patent document 1 describes that there are following problems, in the case where the reflected power is increased while the forward power is controlled to be constant.

In the case where the forward power is controlled to be constant, a peak value of the forward power is controlled to be constant. Therefore, if the reflected power is increased, the amount of the power supplied to the load is lowered, and a plasma state within the chamber is changed, thereby causing the load impedance to fluctuate. This fluctuation may cause a deviation from the matching state, failing to keep the plasma, and accordingly, the plasma disappears.

Furthermore, when the amount of the power supplied to the load becomes unstable and the load side impedance fluctuates, a target point of the matching also becomes unstable. Accordingly, a target position of a variable impedance element of the matching circuit may also become unstable, and there is a possibility that the variable impedance element causes a hunting phenomenon. Such hunting phenomenon during the process of matching as described above may operate only a part of the variable impedance element of the matching circuit, and it may shorten a lifetime of the variable impedance element.

Therefore, in a conventional power control, when the output power such as forward power and load power is controlled, the output power is increased or decreased in accordance with the fluctuations of the reflected power. Therefore, power amplitude of the output power becomes unstable, causing problems such as fluctuations of the plasma state within the chamber.

An object of the present invention is to solve such conventional problems as described above by controlling the power amplitude (peak power) of the output power to be constant against the power variation in a pulse power control, so as to avoid an effect on the load due to the fluctuations of the power amplitude of the output power.

Another object of the present invention is to control stably the power amplitude of the output power, thereby stabilizing the plasma density and plasma atmosphere on the load side, and enhancing both the process homogeneity obtained by the plasma treatment and a product quality obtained by the process.

Furthermore, another object of the present invention is to suppress average reflected power against the increase of reflected power, so as to protect the power supply device, and simultaneously maintain the power amplitude of the forward power (peak forward power), thereby eliminating unnecessary matching operation of the matching circuit and stabilizing the plasma load.

Another object of the present invention is to facilitate generation of plasma within the chamber at the time of process start at the load.

SUMMARY OF THE INVENTION

The present invention is directed to a power control including; an output amplitude control which performs a constant power control so that the power amplitude of output power becomes equal to a set value, and a duty control for controlling a duty ratio of pulse power so that an amount corresponding to an amount of the output power becomes equal to a set value, thereby establishing a stable control over the power amplitude of the output power and protecting the power supply device against the increase of reflected power.

The present invention includes an aspect of a pulse modulated RF power control method and an aspect of a pulse modulated RF power supply device, and both or each of the aspects of the invention commonly incorporates an output amplitude control which performs a constant power control over the power amplitude of the output power, and a duty control for controlling, by use of the duty ratio of pulse power, an amount corresponding to an amount of the output power, thereby implementing a stable control over the power amplitude of the output power and protection of the power supply device against the increase of reflected power.

A pulse modulated RF power control method according to the present invention is a method for controlling RF power, which controls the RF power to be supplied to a load. The RF output, which is outputted to the load according to the control method of the present invention, is a pulse output. A continuous output is a RF power which is outputted continuously in time wise, whereas the pulse output is a RF power which is outputted intermittently in time wise. The pulse output being intermittent in time wise is provided with two time periods alternately; a time period when peak power is supplied to the load (ON period), and a time period when power smaller than the peak power is supplied to the load (OFF period). In here, the time period when the peak power is supplied to the load is assumed as ON period, and the time period when power smaller than the peak power is supplied to the load is assumed as the OFF period. The power is supplied in a combination of the ON period and the OFF period, the combination being assumed as one cycle.

FIG. 27 is a diagram for explaining a pulse modulated RF control in which a pulse output of RF power is supplied to a load. In FIG. 27A, the RF power is supplied intermittently in time wise, in which Tcyc is assumed as one cycle. The one cycle (Tcyc) is provided with ON period (Ton) and OFF period (Toff). The pulse modulated RF power control controls a power to be supplied to a load by taking control of a ratio of ON period and OFF period (duty ratio) in which a RF power is supplied in ON period and a RF power is regulated in OFF period.

FIG. 27A and FIG. 27B illustrate a same output state.

FIG. 27B shows a simplified change state of a RF power in ON period.

Each figure in the following description simplifies an output state of a RF power in the same way as FIG. 27B.

It is assumed that the OFF period in the present invention includes a time period for supplying power smaller than the peak power, in addition to the time period when the peak power is not supplied to the load. Furthermore, in the present invention, it is assumed that the term "peak" of the peak power indicates maximum power amplitude. By way of example, the "peak forward power" represents forward power having the maximum amplitude value, among the forward power that travels from the RF power source to the load. On the other hand, the forward power whose amplitude value has not reached the maximum amplitude is simply denoted as "forward power".

The pulse modulated RF power control method of the present invention includes an output amplitude control step for controlling amplitude of a pulse output, and a duty control step for controlling a duty ratio of the pulse output.

The output amplitude control step controls an amplitude value of the pulse output and performs a constant amplitude control so that an amplitude value becomes equal to a set amplitude value. For example, the constant amplitude control according to the output amplitude control gives a feedback of the amplitude value of the pulse output, which is outputted by the power control, obtains a difference value between the feedback value and a set amplitude value, and controls the amplitude value of the pulse output so that the difference value becomes zero. The output amplitude control can be implemented by the PWM (pulse width modulation) control. For example, duration of the ON period is adjusted to form a pulse control signal based on the difference value, and then, inputted DC power is subjected to switching by the pulse control signal being formed, thereby controlling the amplitude value of the pulse output.

A duty control step controls the duty ratio of the pulse output, and performs the constant power control so that a power amount determined by the duty ratio becomes equal to a set power value.

Here, the power amount to be subjected to the constant power control by the duty control step may be, for instance, an average power value of the peak forward power, or an average power value of peak load power which is obtained from the peak forward power and peak reflected power. Here, the peak reflected power corresponds to the maximum amplitude of the reflected power which returns to the RF power source side from the load, and the peak load power corresponds to the maximum amplitude of the load power which is supplied to the load.

Both the average power value of the peak forward power and the average power value of the peak load power correspond to an average power value of the power which is supplied from the RF power source side to the load side.

The constant power control in the duty control step is to control the power amount supplied from the RF power source to the load side so that the power amount becomes equal to a set power value, and it is kept constant independently of the temporal fluctuations. The power amount is not limited to the average power value of the peak forward power or the peak load power, taken as an example in the description above, but a media value or a most-frequent value of the peak forward power or the peak load power may also be applicable, which are values constantly representing the amount of the power.

The pulse modulated RF power control method according to the present invention performs the output amplitude control step and the duty control step independently, and performs pulse modulation of the RF power, whereby the both controls are operated without interfering with each other. Accordingly, for example, it is possible to operate the controls so that the peak forward power becomes constant, and simultaneously the average forward power also becomes constant.

The output amplitude control step and the duty control step may also perform the controls, assuming the voltage and current supplied to the load as control targets of the pulse output, in addition to the power supplied to the load.

In the pulse modulated RF power control method according to the present invention, the duty control step further includes a step for setting the OFF-time in which a RF power is not outputted to zero by controlling the duty ratio, and performing the control so that the power amount of the pulse output becomes equal to an amplitude value of the pulse output, so as to switch the pulse output to a continuous output.

The pulse modulated RF power control method of the present invention may include two modes; a mode for performing a control assuming the peak forward power as a control target, and a mode for performing a control assuming average load power as the control target.

In the duty control step, in the mode for performing the control assuming the peak forward power as the control target, the control target of the pulse output is directed to the peak forward power. In the output amplitude control step, the constant amplitude control is performed so that an amplitude value of the peak forward power becomes equal to a set amplitude value. In the duty control step, the constant power control is performed so that an average power value of the peak forward power determined by the duty ratio becomes equal to a set power value, and accordingly, the peak forward power is controlled.

The duty control step includes a pulse output control for producing discontinuous output, and a continuous output control for rendering the pulse output to be a continuous output.

In the pulse output control, the ON period is set to be less than 100% in the duty ratio which is determined by the ON period and OFF period in one cycle of a pulse output, and an average power value of the peak forward power is controlled to become smaller than an amplitude value of the peak forward power, so that the pulse output is rendered to be a discontinuous output.

In the continuous output control, the OFF period is set to be 0% and the ON period is set to be 100% in the duty ratio which is determined by the ON period and OFF period within one cycle of the pulse output, so that the pulse output is rendered to be a continuous output.

This control makes the average power value of the peak forward wave power is controlled to become equal to the amplitude value of the peak forward wave power.

In the duty control step, in the mode for performing the controlling assuming the average load power as a control target, a control target of the pulse output is directed to the peak forward power in the output amplitude control step, and a control target of the pulse output is directed to the average load power in the duty control step. The output amplitude control step performs the constant amplitude control so that the amplitude value of the peak forward power becomes constant, and the duty control step performs the constant power control so that an average power value of the peak load power, obtained from the peak forward power and peak reflected power determined by the duty ratio, becomes equal to a set power value, and accordingly, the average load power is controlled.

In the duty control according to the present invention, the duty ratio of the pulse output is increased or decreased, on the basis of a feedback value which is obtained by the constant power control in the output amplitude control step.

In the control for increasing or decreasing the duty ratio, the duty control step gives a feedback of the peak reflected power value, and when the peak reflected power is increased, the proportion of the ON period in the duty ratio is reduced, so as to suppress the increase of the average reflected power.

In the control for increasing or decreasing the duty ratio, the duty control step gives a feedback of the peak reflected power value, and when the peak reflected power is increased, the proportion of the ON period in the duty ratio is enlarged, so as to control the average load power to be constant.

In the load power control, upon the fluctuation of the peak reflected power, if the peak forward power is controlled to perform the peak load power control, there is a possibility that the plasma density on the load side may fluctuate and it may bring about instability due to the fluctuation of the peak forward power. On the other hand, if the proportion of the ON period of the duty ratio is adjusted to control the average load power to become a constant value, it is possible to stabilize an output of the peak forward power.

In the case where RF power is controlled by the continuous output control, if an amplitude value of the peak reflected power is excessive, a pulse modulated RF power control method according to the present invention can be applied, thereby suppressing the increase of the average reflected power.

A control mode to which the pulse modulated RF power control can be applied, instead of the continuous output control, includes a continuous forward power control mode and a process start control mode; the former is a control mode for supplying the peak forward power according to a continuous output in a steady-state, and the latter is a control mode for starting the plasma load process by an RF power supply device and igniting the plasma.

In the continuous forward power control mode, a constant peak forward power is outputted continuously in the steady-state, and when the amplitude value of the peak reflected power becomes excessive during this continuous outputting, a pulse output control is applied by switching from the continuous output control, thereby controlling the duty ratio and accordingly suppressing the increase of the average reflected power.

On the other hand, in the process start control mode, the pulse output control is applied during a stage for increasing the peak forward power, and after the peak forward power reaches a predetermined value, the pulse output control is switched to the continuous output control. When an amplitude value of the peak reflected power becomes excessive during the increase of the peak forward power, the continuous output control is switched to the pulse output control and it is applied, thereby controlling the duty ratio and accordingly suppressing the increase of the average reflected power.

In the control mode for supplying the peak forward power in the steady-state (continuous forward power control mode), there is a possibility that the impedance within the chamber is changed due to a variation of gas pressure or ion reactions during the process, and the reflected power is increased temporarily. In the situation where the reflected power is increased as described above, if the output power is lowered as conventional manner, the plasma within the chamber becomes unstable due to combined movement of the matching operations of the matching circuit.

On the other hand, in the present invention, the proportion of the ON period of the pulse duty ratio is assumed as 100%, and the average forward power and the peak forward power are made to match, so as to establish the continuous forward power control mode. Under such condition, if an amplitude value of the peak reflected power is excessive, the proportion of the ON period of the duty ratio is reduced from 100%, and the continuous output control is switched to the pulse output control, thereby suppressing the increase of the average reflected power.

With the control as described above, it is possible to avoid variation of the peak forward power, enabling stabilization of the power supply to the load.

It is to be noted that in the process start control mode, there is a tendency that the peak reflected power is increased before the ignition of plasma. On this occasion, if the output power is lowered as conventionally done, the output voltage becomes lower than the voltage necessary for igniting the plasma in the chamber, making it difficult to ignite the plasma.

On the other hand, in the process start control mode of the present invention, the peak forward power is supplied while being increased in the continuous output control, and if an amplitude value of the peak reflected power is excessive in the course of increasing the peak forward power, the proportion of the ON period of the duty ratio is reduced from 100% and the continuous output control is switched to the pulse output control. Then, following after the peak reflected power is lowered to an allowable range by igniting the plasma, the peak forward power is increased, and subsequently, the proportion of the ON period of the duty ratio is restored to 100% and the pulse output control is switched to the continuous output control. Accordingly, it is possible to suppress the increase of the average reflected power during the time period when the peak forward power is increased.

According to the control as described above, even when the peak reflected power is increased, supplying of the peak forward power is maintained while suppressing the average reflected power. Therefore, this facilitates ignition of plasma, and after the ignition of plasma within the chamber, the plasma atmosphere becomes normal and the peak reflected power is decreased. Accordingly, the proportion of the ON period of the duty ratio is restored to 100% by the duty control, and the pulse output control is switched to the continuous output control.

It is determined whether the amplitude value of the peak reflected power is excessive or not, by comparing a feedback value of the peak reflected power with a set value, for example. In addition, it is further possible to make a determination by comparing an increase rate of the feedback value of the peak reflected power with a set value.

The process start control mode can be executed by the duty control, instead of the aforementioned continuous output control.

In the duty control during the process start control mode, when an amplitude value of the peak reflected power is excessive, the proportion of the ON period of the duty ratio is gradually increased, thereby suppressing the increase of the average reflected power.

With the control above, even when the peak reflected power is increased, supplying of the peak forward power can be maintained while suppressing the average reflected power. Therefore, ignition of plasma is enabled, and after the ignition of the plasma within the chamber, the plasma atmosphere becomes normal, then reducing the peak reflected power. Consequently, the proportion of the ON period of the duty ratio is changed to 100% by the duty control, and the duty control is switched to the continuous output control.

In the duty control of the pulse modulated RF power control according to the present invention, one cycle of the pulse output includes ON period and OFF period, and there are two power control modes according to the power level in each of the time periods.

One of the power control modes is ON/OFF power control where a power value of the pulse output during the OFF period is assumed as zero, and a power value of the pulse output during the ON period is assumed as a set power value, in the duty control. The other power control mode is HIGH/LOW power control where a power value of the pulse output during the OFF period is assumed as a predetermined power value which is defined between zero and a set power value, and a power value of the pulse output during the ON period is assumed as the set power value.

The HIGH/LOW power control sets the power level of the pulse during the LOW period to be equal to or higher than the predetermined value, thereby avoiding the state that the plasma during the OFF period disappears.

In the pulse modulated RF power control of the present invention, more than one control mode can be applied as the duty control.

One of the control modes as the duty control is the PWM (pulse width modulation) control which uses a constant frequency, and it controls a ratio of duration between the ON period duration and the ON period duration, while keeping the frequency constant. The other control mode of the duty control is the PFM (pulse frequency modulation) control which uses constant ON period duration or constant OFF period duration, and it controls the frequency of the pulse output by varying the OFF period duration, while keeping the ON period duration constant, or by varying the duration of the ON period, while keeping the duration of the OFF period constant.

The PWM amplitude control performed by the output amplitude control is to control an amplitude value of the pulse output by switching the input DC power, and the PWM control performed by the duty control is to control the average forward power while keeping the amplitude value controlled by the output amplitude control. Control targets of those controls are different from each other, and they do not interfere to each other, thereby allowing independent controls, respectively. Accordingly, even when the peak reflected power is increased, it is possible to control the average forward power without lowering the amplitude value of the peak forward power.

Next, one aspect of the pulse modulated RF power supply device according to the present invention will be explained.

The pulse modulated RF power supply device of the present invention is to supply RF power to a load, and includes an RF output part for outputting an RF output of a pulse output, an output amplitude control part for controlling amplitude of the pulse output, and a duty control part for controlling a duty ratio of the pulse output.

The output amplitude control part controls an amplitude value of the pulse output, and performs the constant amplitude control so that the amplitude value becomes equal to a set amplitude value. The duty control part controls the duty ratio of the pulse output, and performs the constant power control so that a power amount determined by the duty ratio becomes equal to a set power value. The output amplitude control part and the duty control part respectively control the RF output part independently, thereby performing pulse modulation of the RF power.

The pulse modulated RF power supply device of the present invention has the configuration including the output amplitude control part and the duty control part as described above, and this configuration allows implementation of each of the control elements incorporated in the pulse modulated RF power control as discussed above.

It is to be noted that the control elements of the pulse modulated RF power control, which are implemented by the pulse modulated RF power supply device, are the same as those already described above, and therefore tedious explanations will not given here.

Hardware for implementing each of the control elements of the pulse modulated RF power control may constitute the output amplitude control part and the duty control part. In addition, a CPU, programs for implementing each of the control elements, a memory for storing calculation results, and the like, may also constitute those control parts.

The output amplitude control part may incorporate, for example, an error detector for obtaining a difference between the set amplitude value (amplitude command value) and an amplitude value of the pulse output which is a feedback from the RF output part, and a PWM controller for performing the PWM control based on a difference value detected by the error detector, as to the pulse signals from an oscillator.

The duty control part may incorporate, for example, an error detector for obtaining a difference value between the set power value (average power command value) and an average value of the feedback from the RF output part, and a duty ratio modifier which modifies the duty ratio of the pulse signal based on a difference value detected by the error detector, as to the pulse signals from the oscillator.

The RF output part performs pulse modulation of DC power and outputs RF power. The RF output part performs the constant amplitude control of the DC power based on control signals from the output amplitude control part, and performs pulse modulation so that an amplitude value becomes equal to the set amplitude value. Subsequently, the RF control part controls the duty ratio of the pulse output which is subjected to the constant amplitude control by the output amplitude control part, based on the control signal from the duty control part, and performs the constant power control so that the amount of pulse output power becomes equal to the set power value.

The RF output part is provided with an amplifier which performs the constant amplitude control over DC power based on the control signal from the output amplitude control part and outputs a pulse output, and a switching circuit for performing the constant power control over the pulse output from the output amplitude control part, based on the control signal from the duty control part. In addition, the RF output part is further provided with a detector for detecting the pulse output subjected to the pulse modulation in the duty control part, and gives a feedback of the pulse output to the output amplitude control part and the duty control part. The detector provided in the RF output part not only detects the power of the pulse output, but also detects voltage and current, allowing any of such detected values to be used as a feedback value.

The RF output part supplies the pulse output to a load. In supplying the pulse output, a matching box is provided between the RF output part and the load, so as to carry out impedance matching.

According to an aspect of the present invention, the power amplitude of the output power is stably controlled, thereby stabilizing plasma density and plasma atmosphere on the load side, and enhancing both the process homogeneity obtained by the plasma treatment and a product quality obtained by the process.

According to an aspect of the present invention, the average reflected power is suppressed against the increase of the reflected power, so as to protect the power supply device, while the power amplitude (peak forward power) of the forward power is maintained, thereby eliminating the need for unrequisite matching operations of the matching box, and stabilizing the plasma load.

Furthermore, according to an aspect of the present invention, generation of plasma within the chamber is facilitated at the time of process start on the load side.

As described above, according to the pulse modulated RF power control method and the pulse modulated RF power supply device of the present invention, it is possible to control the power amplitude (peak power) of the output power to be constant against the power fluctuations in the pulse power control, thereby avoiding effects on the load, which is caused by the fluctuation of the power amplitude of the output power.

BRIEF DESCRIPTION OF THE DRAWINGS

FIG. 2 is a diagram for explaining a duty control according to the present invention;

DESCRIPTION OF THE PREFERRED EMBODIMENTS

Figure 1:
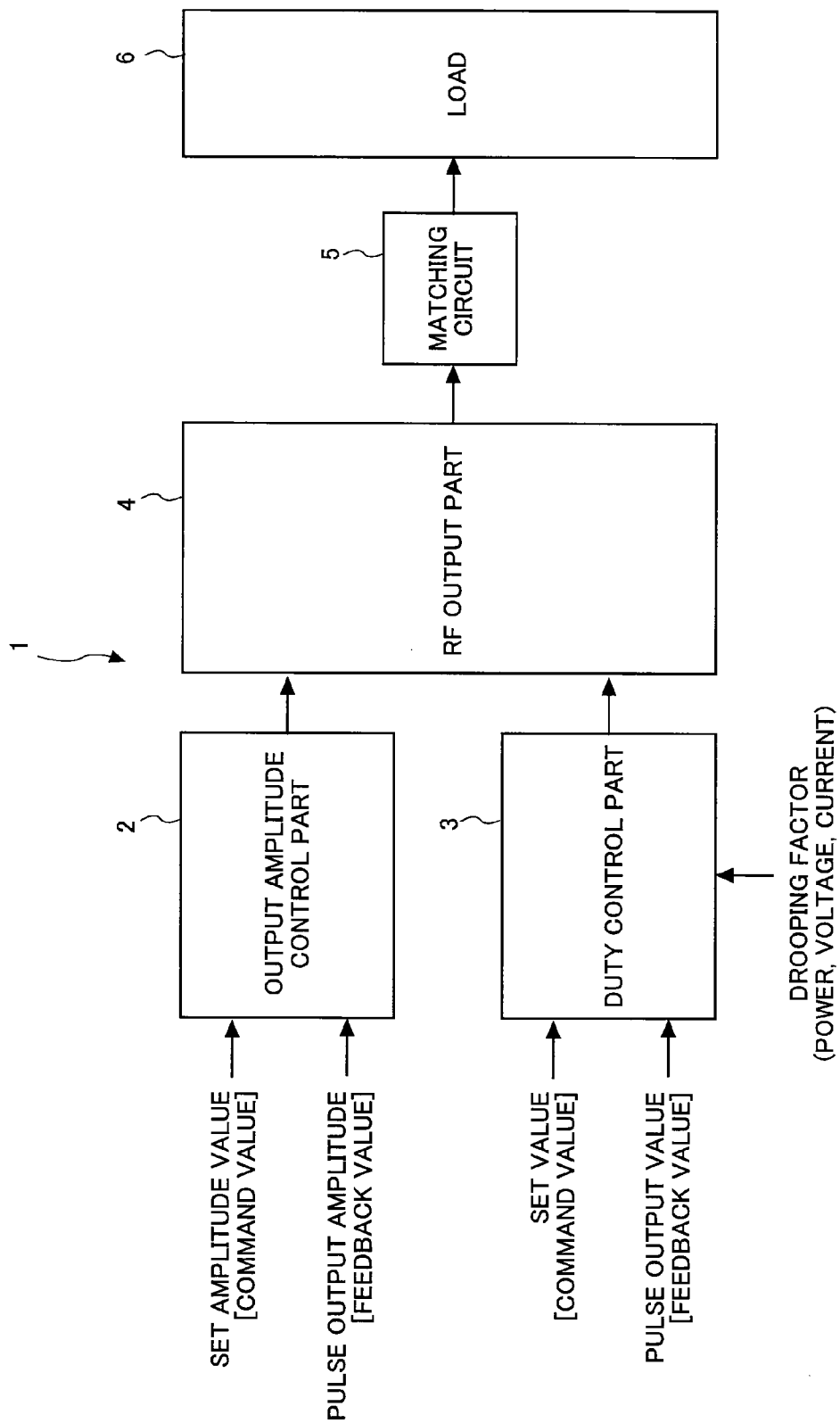
FIG. 1 is a diagram for explaining a schematic configuration of a pulse modulated RF power supply device according to the present invention.

Hereinafter, with reference to the accompanying drawings, preferred embodiments of the present invention will be explained in detail.

With reference to FIG. 1 to FIG. 5, a basic configuration of the pulse modulated RF power supply device of the present invention and the pulse modulated RF power control method of the present invention will be explained; with reference to FIG. 6 to FIG. 8, an explanation will be made as to an example where forward power is taken as a control target; with reference to FIG. 9 to FIG. 12, an explanation will be made as to an example of a processing when the peak reflected power is increased; with reference to FIG. 13 to FIG. 16, an explanation will be made as to the case where a load of the pulse output is controlled by the pulse peak load power control; with reference to FIG. 17 to FIG. 20, an explanation will be made as to the case where the duty control is applied to the continuous forward power control mode; with reference to FIG. 21 to FIG. 24, an explanation will be made as to the case where the duty control is applied to the continuous forward power control mode to increase the peak forward power at a timing such as a process start; with reference to FIG. 25 and FIG. 26, an explanation will be made as to the case where the peak forward power at the timing such as the process start is increased in the duty control.

[Basic Configuration of the Pulse Modulated RF Power Control]

Firstly, with reference to FIG. 1, an explanation will be made as to a schematic configuration of the pulse modulated RF power supply device according to the present invention.

The pulse modulated RF power supply device 1 incorporates an output amplitude control part 2 for controlling amplitude of a pulse output, a duty control part 3 for controlling a duty ratio of the pulse output, and an RF output part 4 for outputting an RF output of the pulse output, and the RF output part 4 outputs the RF output to a load 6. The load 6 may be a plasma load, which is generated within a chamber, for instance.

A matching circuit 5 may be connected between the RF output part 4 and the load 6, so as to match impedance therebetween.

The RF output part 4 performs pulse modulation of DC power and generates an RF output. The DC power can be obtained from a DC power source, or the DC power is obtained by subjecting AC power to AC/DC conversion. The power is transferred bi-directionally between the RF output part 4 and the load 6. Forward power is supplied from the RF output part 4 to the load 6, and reflected power is returned from the load 6 to the RF output part 4. According to a difference between the forward power and the reflected power, load power directing from the RF output part 4 to the load 6 is supplied. In here, maximum amplitude of the forward power is referred to as "peak forward power", and maximum amplitude of the reflected power is referred to as "peak reflected power".

The pulse modulation is performed according to an amplitude control of the pulse output by the output amplitude control part 2 and according to a power amount control by the duty control part 3.

The output amplitude control part 2 inputs a set amplitude value as a command value, inputs an amplitude value of the pulse output as a feedback value, and performs a constant amplitude control so that the amplitude value becomes equal to the set amplitude value. A power value, a voltage value, or a current value may be assumed as the amplitude value of the pulse output, and a detector provided within the RF output part 4, or a detector provided between the RF output part 4 and the load 6 is able to detect this amplitude value. In the constant amplitude control of the output amplitude control part 2, an amplitude value (peak value) of the pulse output is controlled to become equal to the set value.

The duty control part 3 inputs a set value as a command value and inputs a pulse output value as a feedback value. Then, the duty control part controls the duty ratio so that the pulse output value becomes equal to the set value, and performs a constant value control so that a value defined by the duty ratio becomes equal to the set value. The pulse output value may be represented by a power value, a voltage value, or a current value.

It is possible to assume that an amount corresponding to the power value of the pulse output is an average forward power, for instance. In this case, an average output power command value is used as the set value. The constant power control by the duty control part 3 is to perform control so that the power amount becomes equal to the average output power command value constantly, without depending on temporal fluctuations, as to the power supplied from the RF power source side to the load side. This value is not limited to an average power value of the peak forward power or peak load power, but another value constantly representing a power amount may be applicable, such as a media value or a most frequent value of the peak forward power or the peak load power.

The output amplitude control part 2 and the duty control part 3 of the present invention control the RF output part 4, independently, so as to perform the pulse modulation of the RF power.

It is to be noted that in FIG. 1, the output amplitude control part 2 and the duty control part 3 are illustrated as separate elements for ease of explanation, but they may be configured as one control part. Furthermore, the RF output part 4 is illustrated as an individual element, but it may be configured as one circuit together with the combined control part incorporating the output amplitude control part 2 and the duty control part 3.

It is to be noted that each control part and the RF output part may be a hardware configuration, or a software configuration incorporating a CPU, a memory, and the like, which store programs to allow the CPU to execute each signal, and computational processing results.

[Duty Control]

Figure 3:
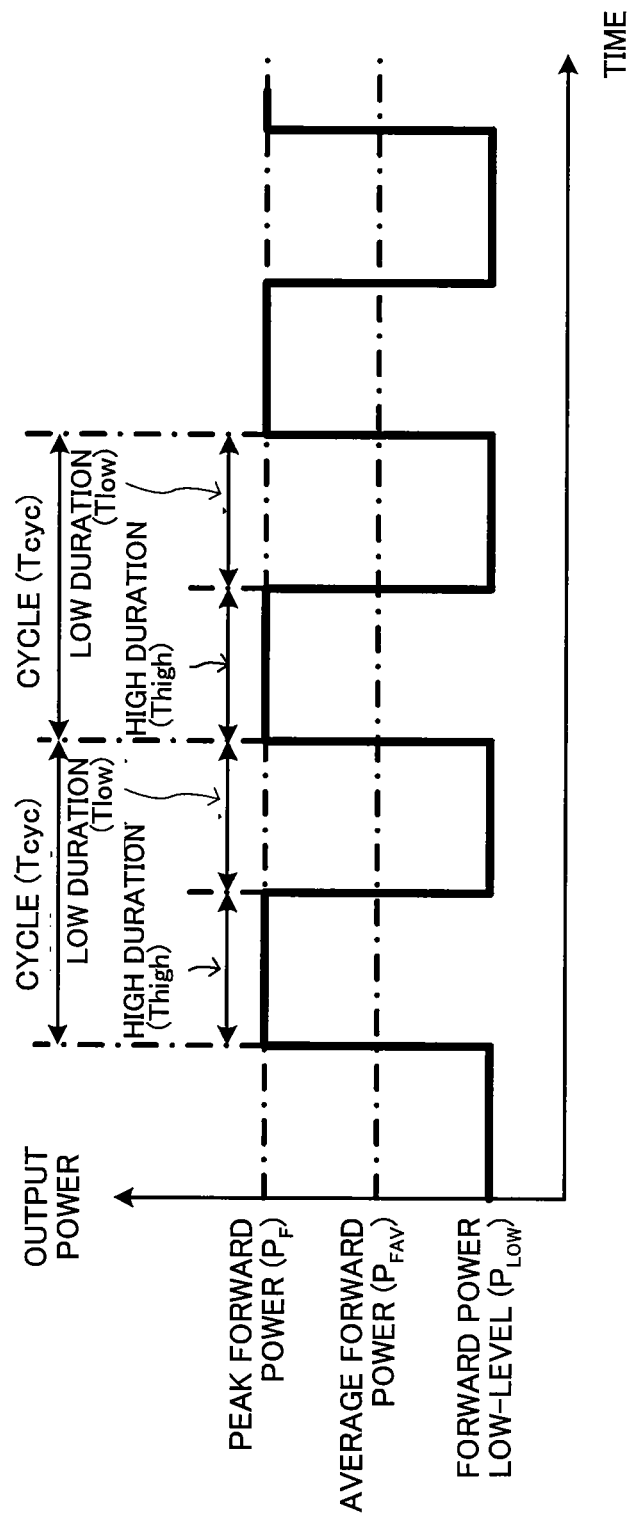
FIG. 3 is a diagram for explaining the duty control according to the present invention.

With reference to FIG. 2 and FIG. 3, a duty control according to the duty control part 3 will be explained.

In the duty control, a duty ratio of a pulse output is changed, thereby performing pulse modulation of an output power value. In here, an explanation will be made taking forward power as an example. In the pulse modulated RF power control according to the present invention, the output amplitude control part 2 performs a control so that the maximum amplitude value (peak value) of the peak forward power $P_F$ becomes equal to a set value. While the peak forward power is maintained to be the set value, the duty ratio is controlled so that the average forward power $P_{FAV}$ becomes equal to a set power value.

One cycle of the pulse power is provided with ON period and OFF period, and there are two power control modes depending on the power level in each of the periods.

One power control mode is ON/OFF power control in the duty control, in which a power value of the pulse output is assumed as zero during the OFF period, and a power value of the pulse output during the ON period is assumed as a set power value. FIG. 2 illustrates this ON/OFF power control. In FIG. 2, one cycle $T_{cyc}$ includes ON duration $T_{on}$ which is a period for outputting the peak forward power, and OFF duration $T_{off}$ which is a period when there is no power output, and the duty ratio is determined based on $T_{on}$ and $T_{off}$. For example, the duty ratio is represented by ON duty $D_{on}$, which is a ratio of ON duration $T_{on}$ to one cycle $T_{cyc}$.

$$D_{on}=T_{on}/(T_{on}+T_{off})$$

$$T_{cyc}=T_{on}+T_{off}$$

The average forward power $P_{FAV}$ can be expressed by the following formula, by using ON duty $D_{on}$.

$$P_{FAV}=P_F\times D_{on}$$

Therefore, by changing ON duty $D_{on}$, it is possible to perform a control so as to allow the average forward power $P_{FAV}$ to be a predetermined power value.

In this duty control, when the duty ratio is controlled so that the average forward power $P_{FAV}$ becomes equal to the set power value, there is a possibility that the average forward power $P_{FAV}$ is made to droop. For example, increase of reflected power (FIG. 2B) or increase of the reflected voltage or current may be a factor which causes drooping of the average forward power $P_{FAV}$.

As shown in FIG. 2A, it is controlled so that ON duty $D_{on}$ is lowered, thereby reducing the average forward power $P_{FAV}$, against the factor to cause the drooping of the average forward power $P_{FAV}$.

Another power control mode is HIGH/LOW power control in the duty control, in which a power value of the pulse output during the OFF period is assumed as a predetermined power value defined in a duration between and equal to zero and a set power value and a power value of the pulse output during the ON period is assumed as the set power value.

FIG. 3 illustrates the HIGH/LOW power control. In FIG. 3, one cycle $T_{cyc}$ includes HIGH duration $T_{high}$ which is a period for outputting the peak forward power, and LOW duration $T_{low}$ which is a period for allowing the power output to be the forward power low level $P_{low}$, being lower than the peak forward power. The duty ratio is determined based on $T_{high}$ and $T_{low}$. For example, the duty ratio can be represented by the ratio of the HIGH duration $T_{high}$ to one cycle $T_{cyc}$, for instance. The average forward power $P_{FAV}$ is determined by this duty ratio, the peak forward power $P_F$, and the forward power low level $P_{low}$.

The HIGH/LOW power control sets a power level of a pulse during the LOW-period to be equal to or higher than a predetermined value, thereby avoiding the state that the plasma disappears during the LOW-period.

Figure 4:
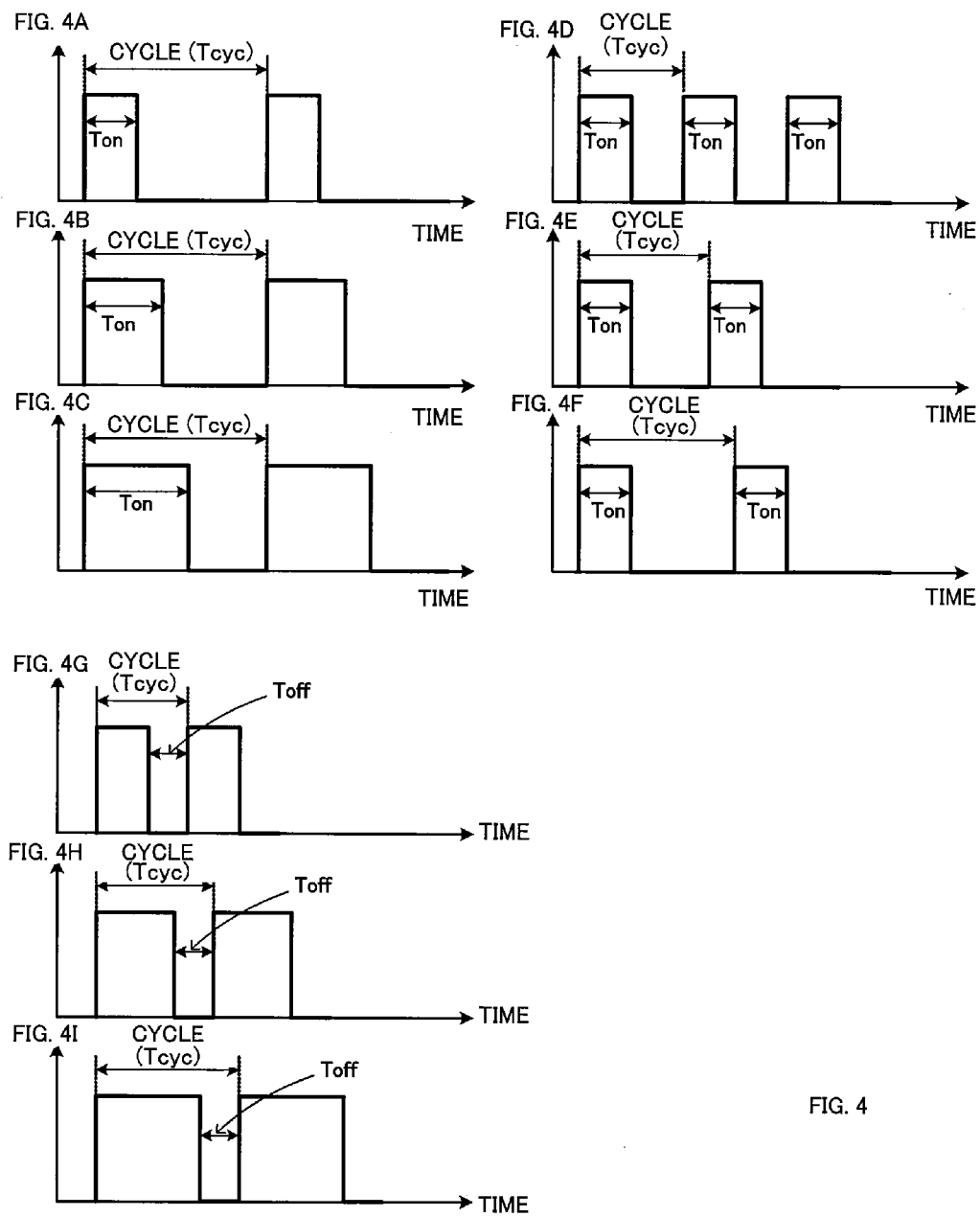
FIG. 4 illustrates control modes of the duty control according to the present invention.

Next, with reference to FIG. 4, control modes of the duty control will be explained.

One control mode of the duty control is the PWM control which keeps the frequency constant. FIG. 4A is a diagram to explain the PWM control.

The frequency is kept constant. In FIG. 4A to FIG. 4C, the cycle $T_{cyc}$ is kept constant. The ratio of time duration between the ON period duration $T_{on}$ and the OFF period duration $T_{off}$ is controlled. FIG. 4A to FIG. 4C are illustrated in an ascending order of the ratio of the time duration $T_{on}$.

Another control mode of the duty control is the PFM control which keeps the ON-duration or OFF-duration constant.

FIG. 4D to FIG. 4F illustrate examples of the PFM control which keeps the time duration of ON period constant, and varies the time duration of OFF period, those examples being illustrated in an ascending order of the OFF period time duration $T_{off}$.

FIG. 4G to FIG. 4I illustrate examples of the PFM control which keeps the time duration of OFF period constant, and varies the time duration of ON period, those examples being illustrated in an ascending order of the ON period time duration $T_{on}$.

[Configuration Example of Pulse Modulated RF Power Supply Device]

Next, with reference to FIG. 5, an explanation will be made as to a more detailed configuration example of the pulse modulated RF power supply device 1.

The RF output part 4 is provided with a circuit part for performing the PWM control over an amplitude value of DC input power based on a control signal from the output amplitude control part 2, and a circuit part for controlling a duty ratio of a pulse output based on a control signal from the duty control part 3.

For example, the circuit part for operating the PWM control may incorporate a switching circuit 4a for changing an amplitude value of the DC input power, and a smoothing circuit 4b for removing a noise component from the DC power whose amplitude value has been controlled by the switching circuit 4a.

As the DC input power, it is possible to employ DC input power obtained from a DC power source, and in addition, DC power which has been converted from AC power obtained from an AC power source via an AC/DC converter is also applicable.

The circuit part for controlling the duty ratio may incorporate a switching circuit 4c which uses as the pulse output, the DC power subjected to the amplitude control by the aforementioned circuit part, and controls the duty ratio of the pulse output so that the power amount becomes equal to a set power value.

The RF output part 4 may incorporate a detection circuit for detecting a feedback value which is given as a feedback to the output amplitude control part 2 and the duty control part 3. It is to be noted that this detection circuit may be provided outside the RF output part 4.

Figure 5:
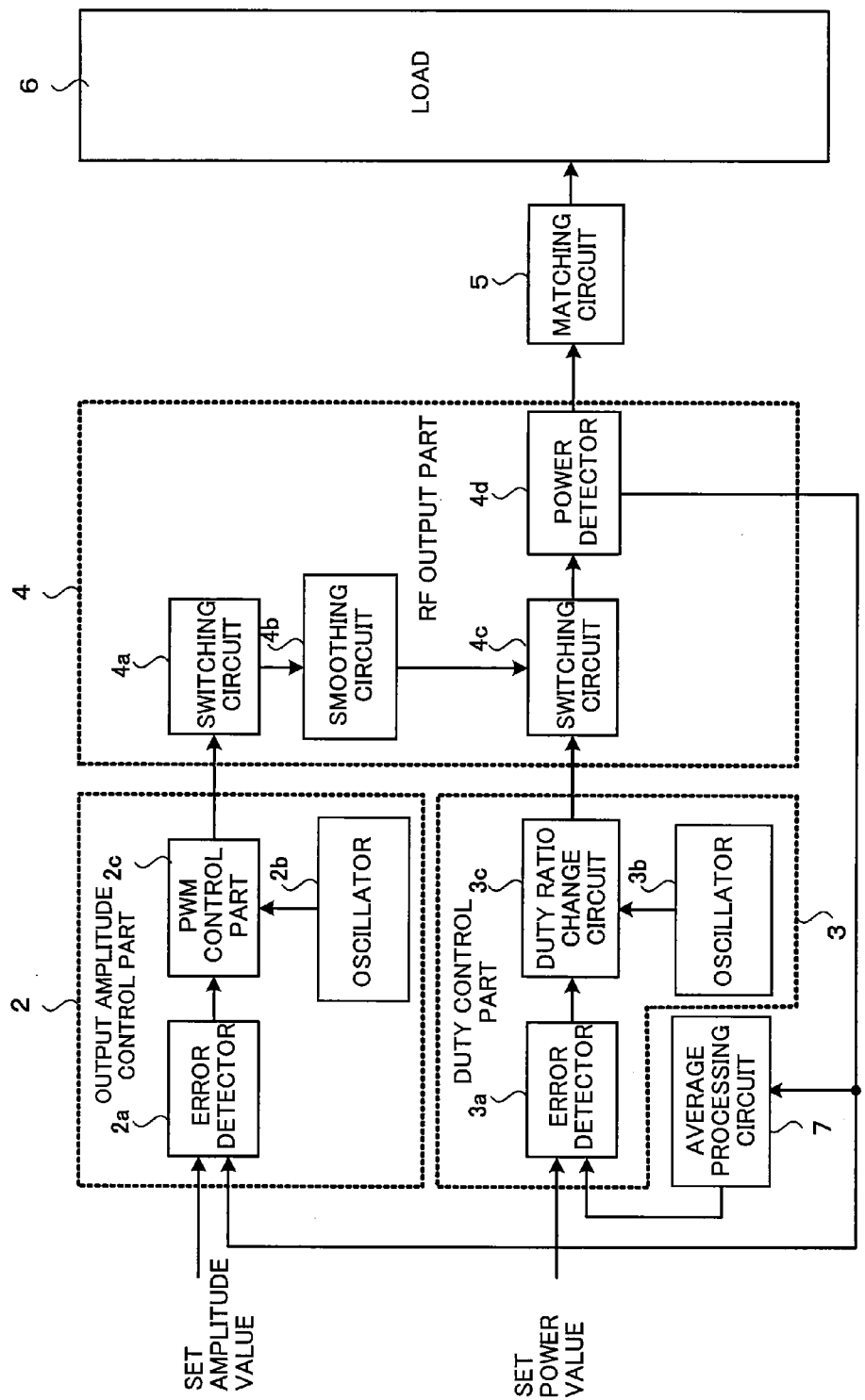
FIG. 5 is a diagram for explaining a detailed configuration example of the pulse modulated RF power supply device according to the present invention.

FIG. 5 shows as a detector, a power detector 4d for detecting peak forward power. The power detector 4d selects and detects the peak forward power by a directional coupler not illustrated. The peak forward power being detected is given as a feedback to the output amplitude control part 2, and simultaneously average forward power, which has been obtained by average processing in the average processing circuit 7, is given as a feedback to the duty control part 3.

The output amplitude control part 2 may incorporate an error detector 2a, an oscillator 2b, and a PWM control circuit 2c, for instance. The error detector 2a inputs a set amplitude value as a command value, simultaneously inputs the peak forward power being a feedback from the RF output part 4 as a pulse output amplitude value of the feedback value, and detects a difference value between the pulse output amplitude value and the set amplitude value.

The PWM control circuit 2c assumes the difference value detected by the error detector 2a as a control signal, and performs the PWM control over the pulse signal from the oscillator 2b. According to the PWM control, the PWM control 2c forms another control signal for performing the control to achieve that the amplitude value becomes equal to the set amplitude value.

The switching circuit 4a of the RF output part 4 controls the amplitude value of DC power, based on the control signal from the PWM circuit 2c.

The duty control part 3 may incorporate an error detector 3a, an oscillator 3b, and a duty ratio change circuit 3c, for instance.

The error detector 3a inputs a set power value as a command value, simultaneously inputs as a power value of a feedback, average forward power which is given as a feedback from the RF output part 4 and having been subjected to the average processing in the average processing circuit 7, and detects a difference value between the power value given as a feedback and the set power value.

The duty ratio change circuit 3c assumes the difference value detected by the error detector 3a as a control signal, and changes the duty ratio of the pulse signal from the oscillator 3b. With the change of the duty ratio, the duty ratio change circuit 3c forms a control signal for performing the control to achieve that the power value becomes equal to the set power value.

The switching circuit 4c of the RF output part 4 controls the duty ratio of the pulse output, based on the control signal from the duty ratio change circuit 3c.

First Embodiment

Configuration and Control when Forward Power is Assumed as a Control Target

Next, as a first embodiment of the present invention, a configuration and control operations will be explained with reference to FIG. 6 to FIG. 8, as to the case where forward power is assumed as a control target.

Figure 6:
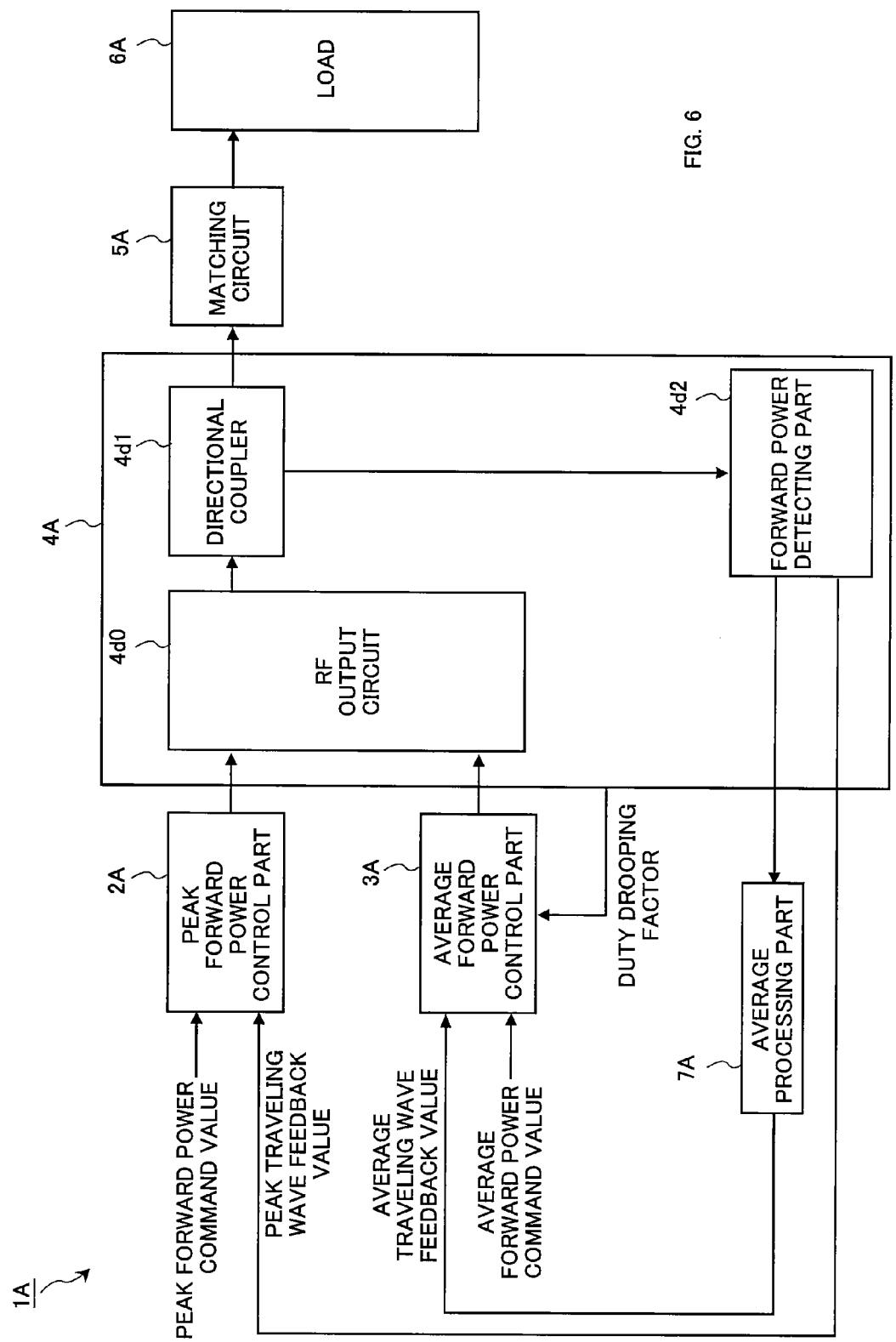
FIG. 6 is a diagram for explaining a configuration example in the case where forward power is assumed as a control target in a first embodiment of the present invention.

FIG. 6 is a diagram for explaining a configuration example in the case where the forward power is assumed as the control target. In FIG. 6, a configuration of the pulse modulated RF power supply device 1A is almost the same as the configuration as shown in FIG. 1, incorporating a peak forward power control part 2A as the output amplitude control part 2 for controlling amplitude of a pulse output, an average forward power control part 3A as the duty control part 3 for controlling a duty ratio of the pulse output, and an RF output part 4A as the RF output part 4 for outputting an RF output of the pulse output. The RF output part 4A outputs the RF output to a load.

The peak forward power control part 2A inputs a peak forward power command value as an amplitude command value, inputs the peak traveling wave feedback value as an amplitude value of the pulse output, and performs a constant amplitude control over the RF output circuit 4d0 of the RF output part 4A so that the amplitude value of the peak forward power becomes equal to the peak forward power command value.

The average forward power control part 3A inputs an average forward power command value as a power command value, inputs the average traveling wave feedback value as a power value of the pulse output, and performs the duty control over the RF output circuit 4d0 of the RF output part 4A, so that the power value of the average forward power becomes equal to the average forward power command value. In this duty control, when the duty ratio is controlled so that the average forward power feedback value becomes equal to the average forward power command value, if a drooping factor arises which makes the average forward power to droop (e.g., increase of reflected power, reflected voltage, current, and the like), ON duty $D_{on}$ is controlled to be lowered, thereby reducing the average forward power.

The directional coupler 4d1 provided in the RF output part 4A separates the forward power, thereby allowing the forward power detector 4d2 to detect a peak traveling wave feedback value. The peak forward power control part 2A inputs this peak traveling wave feedback value.

The average processing part 7A subjects the peak traveling wave feedback value to the average processing, so as to obtain average forward power. The average forward power control part 3A inputs this average forward power as a feedback value.

Figure 7:
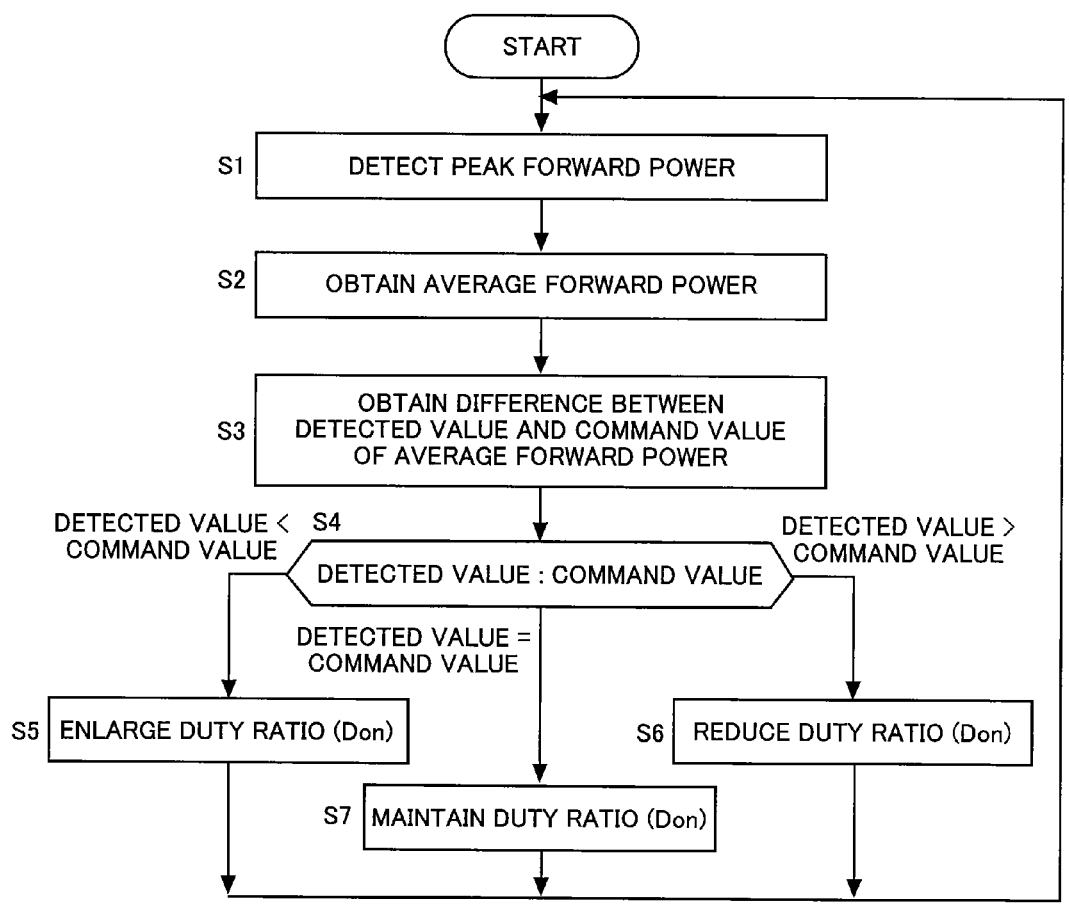
FIG. 7 is a flowchart for explaining an operation example of the duty control in the case where forward power is assumed as a control target in the first embodiment of the present invention.

FIG. 7 and FIG. 8 are a flowchart and a signal diagram, respectively, for explaining an operation example of the duty control using the forward power as a control target.

The forward power detecting part 4d2 detects the peak forward power (S1), an average value of the peak forward power being detected is obtained in the average processing part 7A, and the average forward power being obtained is inputted into the average forward power control part 3A (S2).

The average forward power control part 3A obtains a difference between the average forward power being inputted and the average forward power command value (S3). As to the difference being obtained, if the average forward power is smaller than the average forward power command value (S4), ON duty $D_{on}$ is set to be a larger value (S5), and when the average forward power is larger than the average forward power command value, On duty $D_{on}$ is set to be a smaller value (S6).

When the average forward power matches the average forward power command value, the value of ON duty $D_{on}$ is kept the same without any change (S7).

Figure 8A:
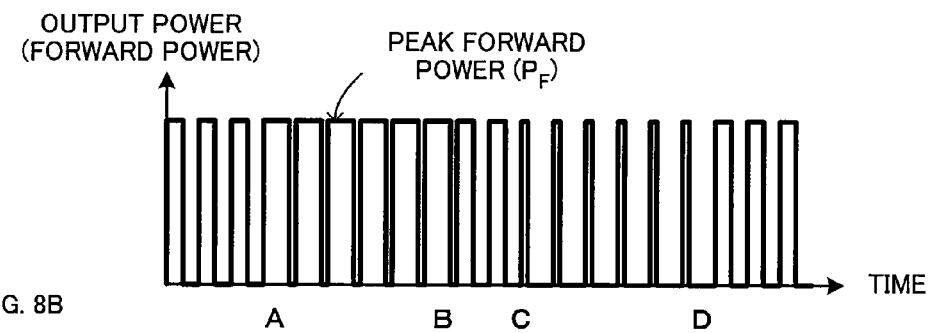
FIG. 8 illustrates signal diagrams for explaining an operation example of the duty control in the case where forward power is assumed as a control target in the first embodiment of the present invention.
Figure 8B:
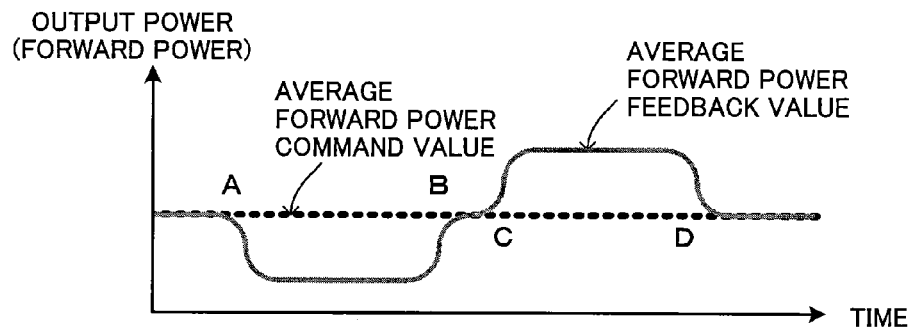
Figure 8C:
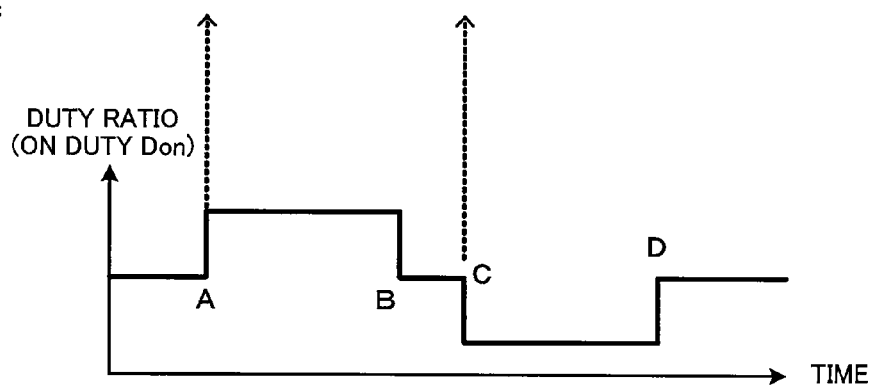

In the signal diagrams shown in FIG. 8, FIG. 8A illustrates the peak forward power $P_F$, FIG. 8B illustrates the average forward power $P_{FAV}$, and FIG. 8C illustrates the duty ratio (ON duty $D_{on}$).

When the feedback value of the average forward power (indicated by the solid line in FIG. 8B) becomes lower than the average forward power command value (indicated by the broken line in FIG. 8B) (time point A in FIG. 8B), ON duty $D_{on}$ is made larger (time point A in FIG. 8C). When ON duty $D_{on}$ becomes large, the ratio of ON period of the peak forward power $P_F$ is also enlarged (time point A in FIG. 8A), and accordingly, the average forward power is increased.

When the feedback value of the average forward power (indicated by the solid line in FIG. 8B) is increased and reaches the average forward power command value (indicated by the broken line in FIG. 8B) (time point B in FIG. 8B), the ON duty $D_{on}$ is restored (time point B in FIG. 8C). By restoring the ON duty $D_{on}$, the ratio of the ON period of the peak forward power $P_F$ is restored (time point B in FIG. 8A).

When the feedback value of the average forward power (indicated by the solid line in FIG. 8B) rises higher than the average forward power command value (indicated by the broken line in FIG. 8 B) (time point C in FIG. 8B), ON duty $D_{on}$ is reduced (point C in FIG. 8 C). When ON duty $D_{on}$ is reduced, the ratio of the ON period of the peak forward power $P_F$ becomes smaller (time point C in FIG. 8A), and accordingly, the average forward power is decreased.

When the feedback value (indicated by the solid line in FIG. 8B) of the average forward power is decreased, and the feedback value reaches the average forward power command value (indicated by the broken line in FIG. 8B) (time point D in FIG. 8B), ON duty $D_{on}$ is restored (time point D in FIG. 8C). When ON duty $D_{on}$ is restored, the ratio of the ON period of the peak forward power $P_F$ is also restored (time point D in FIG. 8A).

Second Embodiment

Control Example when Peak Reflected Power is Increased

Next, as a second embodiment of the present invention, a control of the forward power will be explained with reference to FIG. 9 to FIG. 12, as to the case where the peak reflected power is increased.

Figure 9:
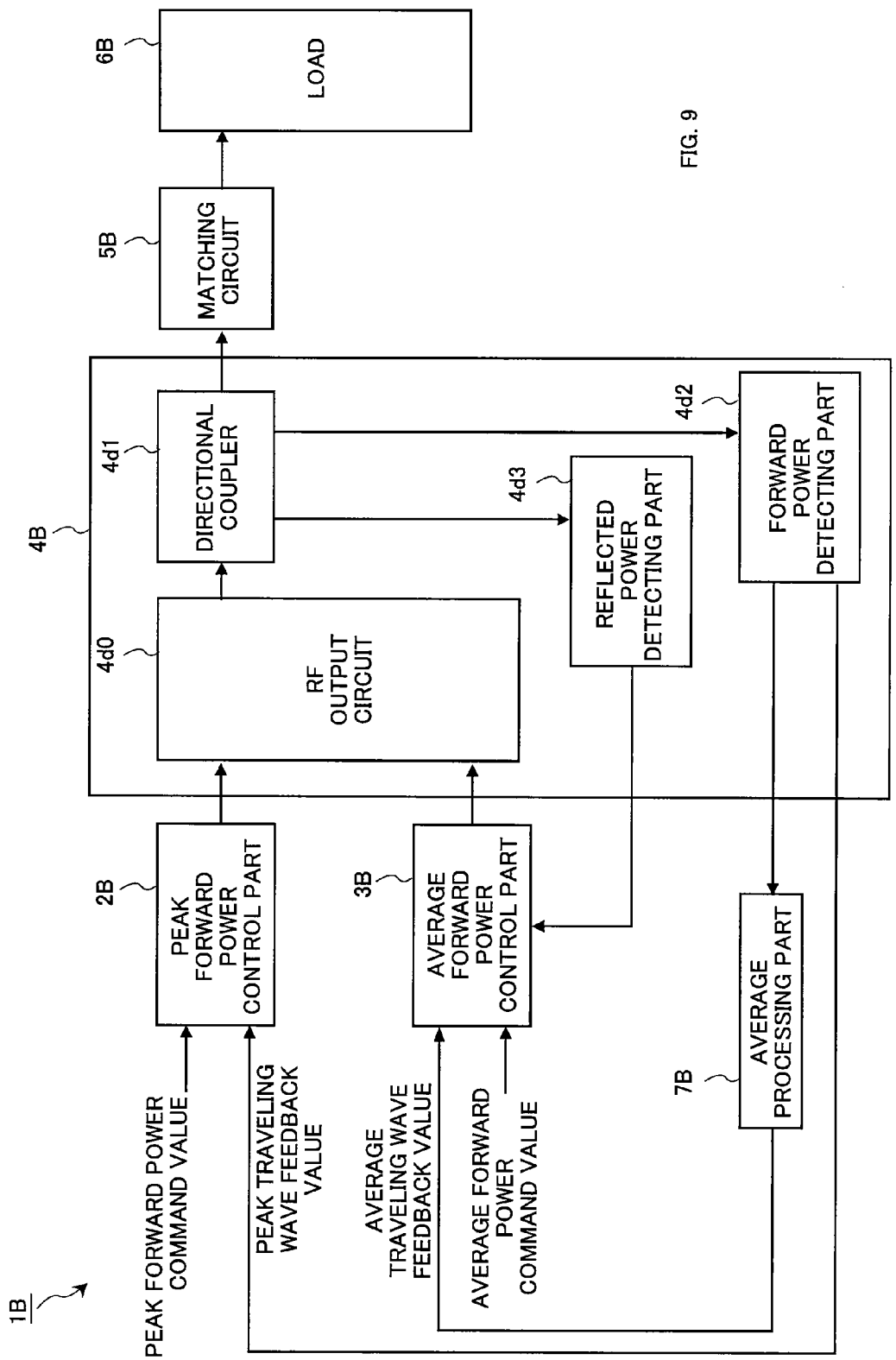
FIG. 9 is a diagram for explaining a configuration example of the control by reflected power in a second embodiment of the present invention.

In FIG. 9, a configuration of the pulse modulated RF power supply device 1B is almost the same as the configuration as shown in FIG. 6, incorporating a peak forward power control part 2B for controlling an amplitude of a pulse output, an average forward power control part 3B for controlling a duty ratio of the pulse output, an RF output part 4B for outputting an RF output of the pulse output, and an average processing part 7B. The RF output part 4B is provided with an RF output circuit 4d0, a forward power detecting part 4d2, a reflected power detecting part 4d3 for detecting peak reflected power, and a directional coupler 4d1 for achieving separation between the peak forward power and the peak reflected power to retrieve the power respectively.

The constitutional elements except the reflected power detecting part 4d3 are almost the same as the configuration of the pulse modulated RF power supply device 1A as shown in FIG. 6. Therefore, mainly the reflected power detecting part 4d3 will be explained hereinafter.

The directional coupler 4d1 achieves separation between the peak forward power and the peak reflected power, inputs the peak forward power in the forward power detecting part 4d2, and inputs the peak reflected power in the reflected power detecting part 4d3.

The reflected power detecting part 4d3 transmits the peak reflected power value being detected to the average forward power control part 3B. The average forward power control part 3B uses the peak reflected power value being transmitted to adjust the duty control. Such duty control adjustment is carried out for protecting the power source by suppressing the average reflected power, when the peak reflected power is increased, for instance. In this duty control adjustment, the peak forward power $P_F$ is controlled to be constant. Therefore, a matching operation of the matching circuit becomes stable, thereby stabilizing the power injection into the chamber.

Figure 10:
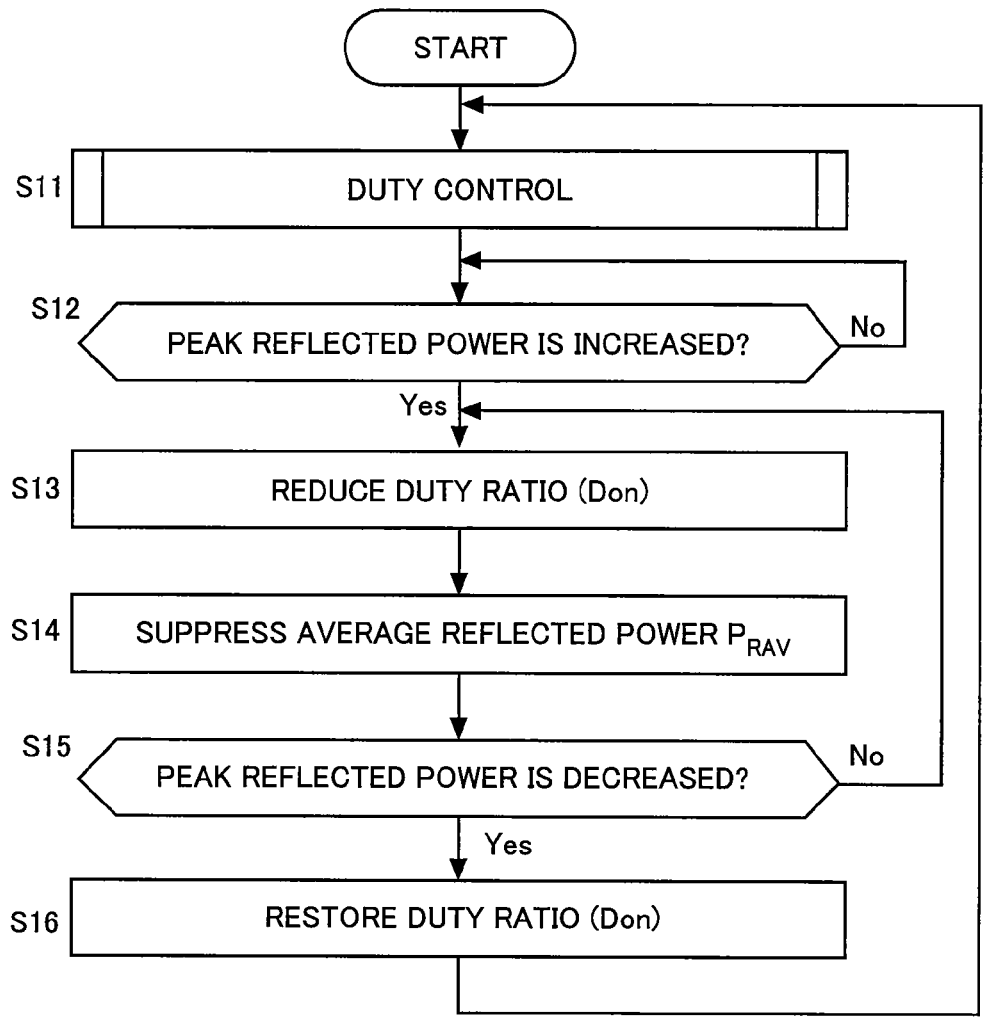
FIG. 10 is a flowchart for explaining an operation example at the time when reflected power is increased in the second embodiment of the present invention.
Figure 11A:
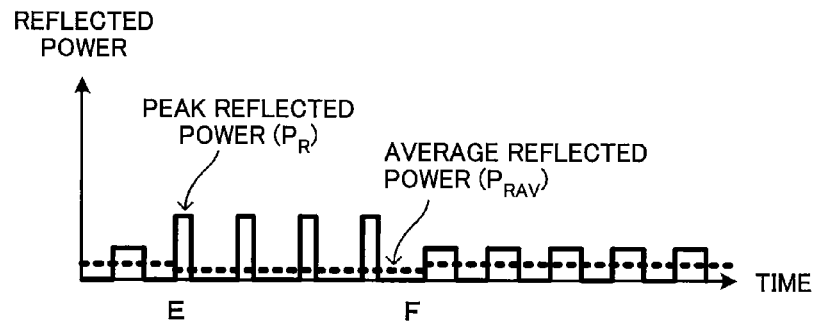
FIG. 11 illustrates signal diagrams for explaining an operation example at the time when reflected power is increased in the second embodiment of the present invention.
Figure 11B:
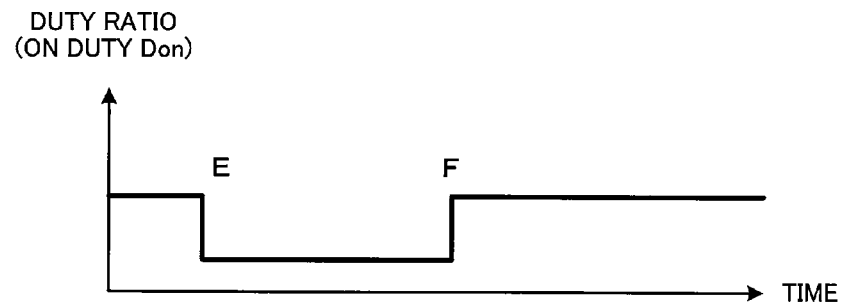
Figure 11C:
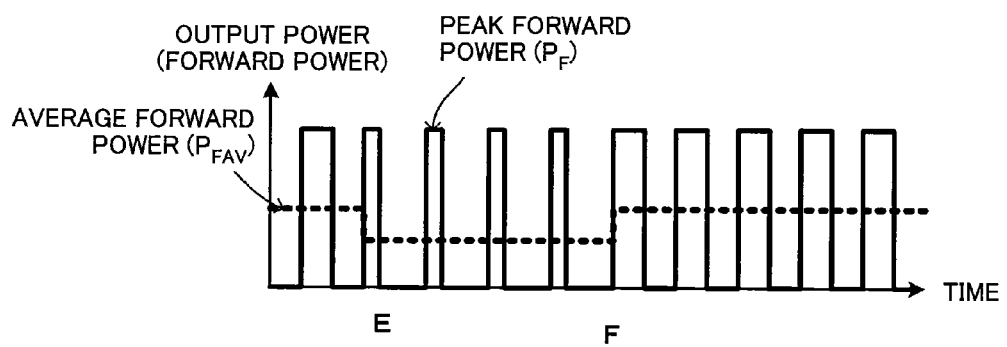
Figure 12:
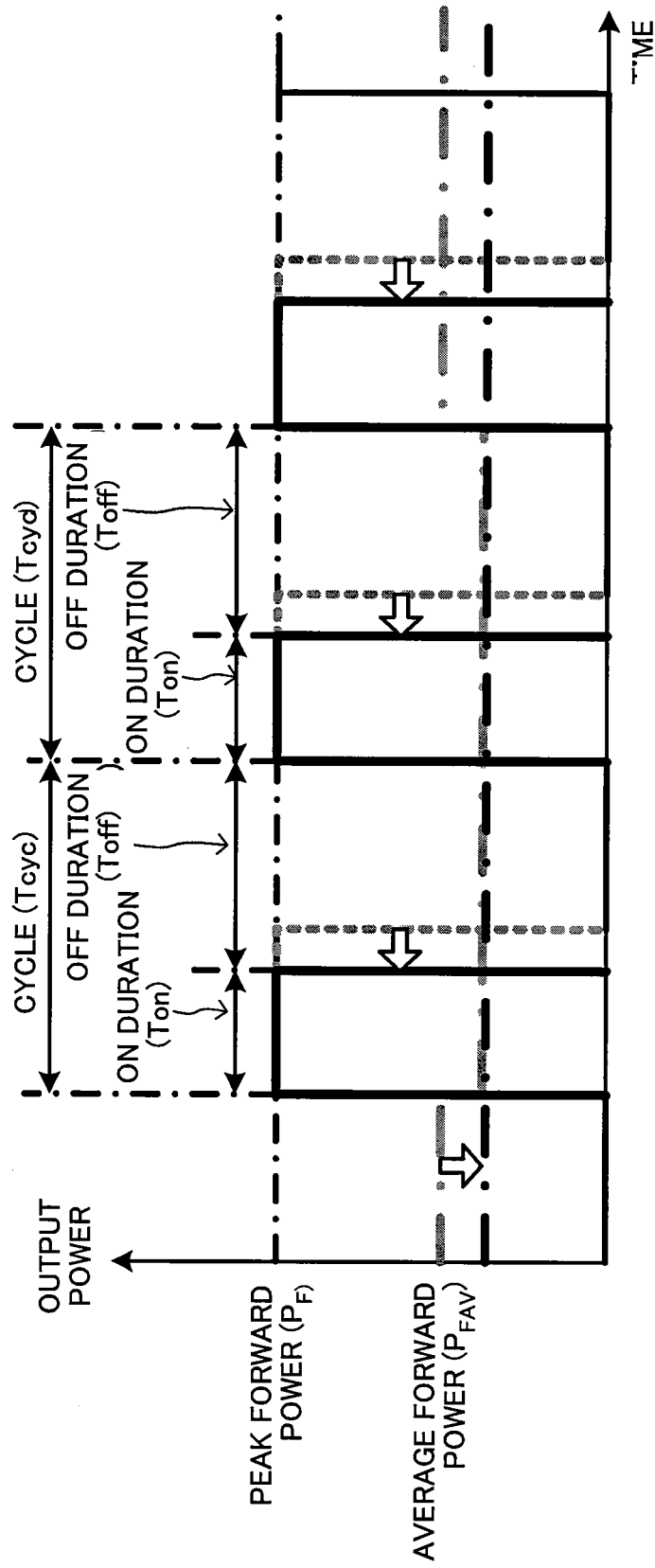
FIG. 12 illustrates a signal diagram for explaining an operation example at the time when reflected power is increased in the second embodiment of the present invention.

FIGS. 10, 11, and 12 are a flowchart and signal diagrams for explaining operation examples of the duty control in the case where the reflected power is increased.

In the duty control (S11), the reflected power detecting part 4d3 detects the reflected power. When the reflected power is increased (S12), the duty ratio obtained in the duty control by the average forward power control part 3B is reduced (S13), and average reflected power $P_{RAV}$ is suppressed (S14).

If suppression of the average reflected power $P_{RAV}$ is insufficient (S15), the duty ratio is further reduced in the step S13. After the average reflected power $P_{RAV}$ is sufficiently suppressed (S15), the reduced duty ratio is restored (S16).

The signal diagrams as shown in FIG. 11 illustrate that the average reflected power is suppressed, in the case where the peak reflected power is increased while the duty control is being performed.

FIG. 11A illustrates the peak reflected power $P_R$ and the average reflected power $P_{RAV}$, FIG. 11B illustrates the duty ratio (ON duty $D_{on}$), and FIG. 11C illustrates the peak forward power $P_F$ and the average forward power $P_{FAV}$.

When the peak reflected power $P_R$ (indicated by a solid line in FIG. 11A) is increased (time point E in FIG. 11A), ON duty $D_{on}$ is reduced (time point E in FIG. 11B). By reducing ON duty $D_{on}$, the ratio of the ON period of the peak forward power $P_F$ is made smaller (time point E in FIG. 11B), the average forward power $P_{FAV}$ is decreased (time point E in FIG. 11C), and accordingly, the average reflected power $P_{RAV}$ is also decreased (time point E in FIG. 11A).

When the feedback value of the peak reflected power is decreased (time point F in FIG. 11A), ON duty $D_{on}$ is restored (time point F in FIG. 11B). By restoring ON duty $D_{on}$, the ratio of the ON period of the peak forward power $P_F$ is restored (time point F in FIG. 11B), the average forward power $P_{FAV}$ is also restored (time point F in FIG. 11C), and then, the average reflected power $P_{RAV}$ is restored (time point F in FIG. 11A).

FIG. 12 illustrates a signal diagram for explaining the relationship between the increase or decrease of the duty ratio (On duty $D_{on}$) and the increase or decrease of the average forward power $P_{FAV}$. FIG. 12 shows the case where the cycle ($T_{cyc}$) is kept constant, and the ON-duration $T_{on}$ is shortened and the OFF-duration $T_{off}$ is expanded, thereby reducing ON duty $D_{on}$. By shortening the period of the ON-duration $T_{on}$ and expanding the period of the OFF-duration $T_{off}$, the power amount of the forward power is decreased, which is supplied in the direction of load within one cycle, and accordingly, the average forward power $P_{FAV}$ is decreased.

Third Embodiment

Configuration and Control of Load Power Control

Next, as a third embodiment of the present invention, a configuration of the load power control and control operations thereof will be explained with reference to FIG. 13 to FIG. 16.

The load power is obtained by subtracting reflected power from forward power, and the load power control controls average load power which is substantially supplied from the pulse modulated RF power supply device to the load, thereby stabilizing the peak forward power output.

The load power control assumes the peak forward power as a control target as to the pulse output in the output amplitude control, assumes the average load power as a control target as to the pulse output in the duty control step. The output amplitude control performs constant amplitude control so that an amplitude value of the peak forward power becomes constant. The duty control controls the average load power, by performing the constant power control so that an average power value of the peak load power becomes equal to a set power value, the average power value being obtained from the peak forward power and the peak reflected power determined by the duty ratio according to the duty control.

Figure 13:
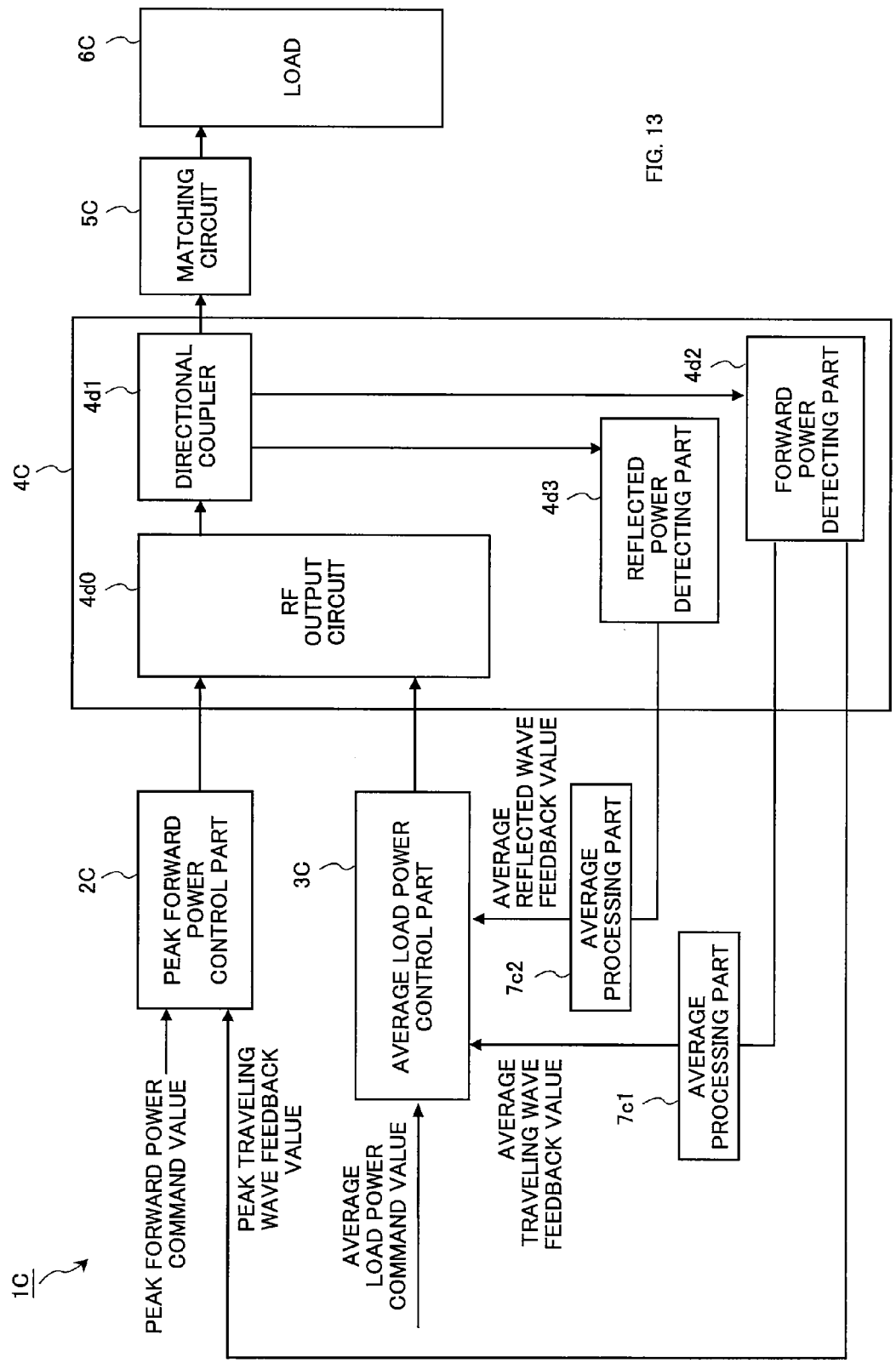
FIG. 13 is a diagram for explaining a configuration example of a load power control in a third embodiment of the present invention.

In FIG. 13, a configuration of the pulse modulated RF power supply device 1C has almost the same configuration as shown in FIG. 9, incorporating a peak forward power control part 2C for controlling an amplitude of the peak forward power, an average load power control part 3C for controlling the duty ratio of a pulse output, an RF output part 4C for outputting an RF output of the pulse output, and an average processing parts 7c1 and 7c2. The RF output part 4C incorporates an RF output circuit 4d0, a forward power detecting part 4d2 for detecting the peak forward power, a reflected power detecting part 4d3 for detecting the peak reflected power, and a directional coupler 4d1 for achieving separation between the peak forward power and the peak reflected power to retrieve the power respectively.

The average processing part 7c1 obtains average forward power from the peak forward power detected by the forward power detecting part 4d2, and the average processing part 7c2 obtains average reflected power from the reflected power detected by the reflected power detecting part 4d3.

The constitutional elements except the average load power control part 3C for performing the duty control over the average load power, and the average processing part 7c2 for obtaining average reflected power from the reflected power are the same as the configuration of the pulse modulated RF power supply device 1B as shown in FIG. 9. Therefore, mainly the duty control operations of the average load power will be explained hereinafter.

The directional coupler 4d1 achieves separation between the peak forward power and the peak reflected power, inputs the peak forward power in the forward power detecting part 4d2, and inputs the peak reflected power in the reflected power detecting part 4d3.

The forward power detecting part 4d2 transmits the peak forward power value being detected to the peak forward power control part 2C, and simultaneously transmits the peak forward power value being detected to the average processing part 7c1. The average processing part 7c1 transmits average forward power being obtained to the average load power control part 3C. In addition, the reflected wave detecting part 4d3 transmits the peak reflected power value being detected to the average processing part 7c2, and the average processing part 7c2 transmits average reflected power to the average load power control part 3C.

The average load power control part 3C is provided with an average load power detecting part (not illustrated) for subtracting the average reflected power value from the average forward power value to obtain an average load power value, and the obtained average load power value, being a feedback value, is compared with the average load power command value, and the duty control is performed so that the average load power value becomes equal to the average load power command value.

It is to be noted that the average load power detecting part is not limited to such configuration as being incorporated in the average power control part 3C. The average load power detecting power may be configured in a circuit, for example the average processing part 7c1 or 7c2, or it may be configured as a self-contained circuit.

The average load power control part 3C uses the peak reflected power value transmitted from the reflected power detecting part 4d3 to adjust the duty control. The adjustment of the duty control is performed, for example, to suppress the average load power when the peak reflected power is increased, and by suppressing the average load power, the peak forward power is suppressed, thereby enabling a protection of the power supply device. In this duty control adjustment, the peak forward power $P_F$ is controlled to be constant.

Therefore, a matching operation of the matching circuit becomes stable, thereby stabilizing the power injection into the chamber.

Figure 14:
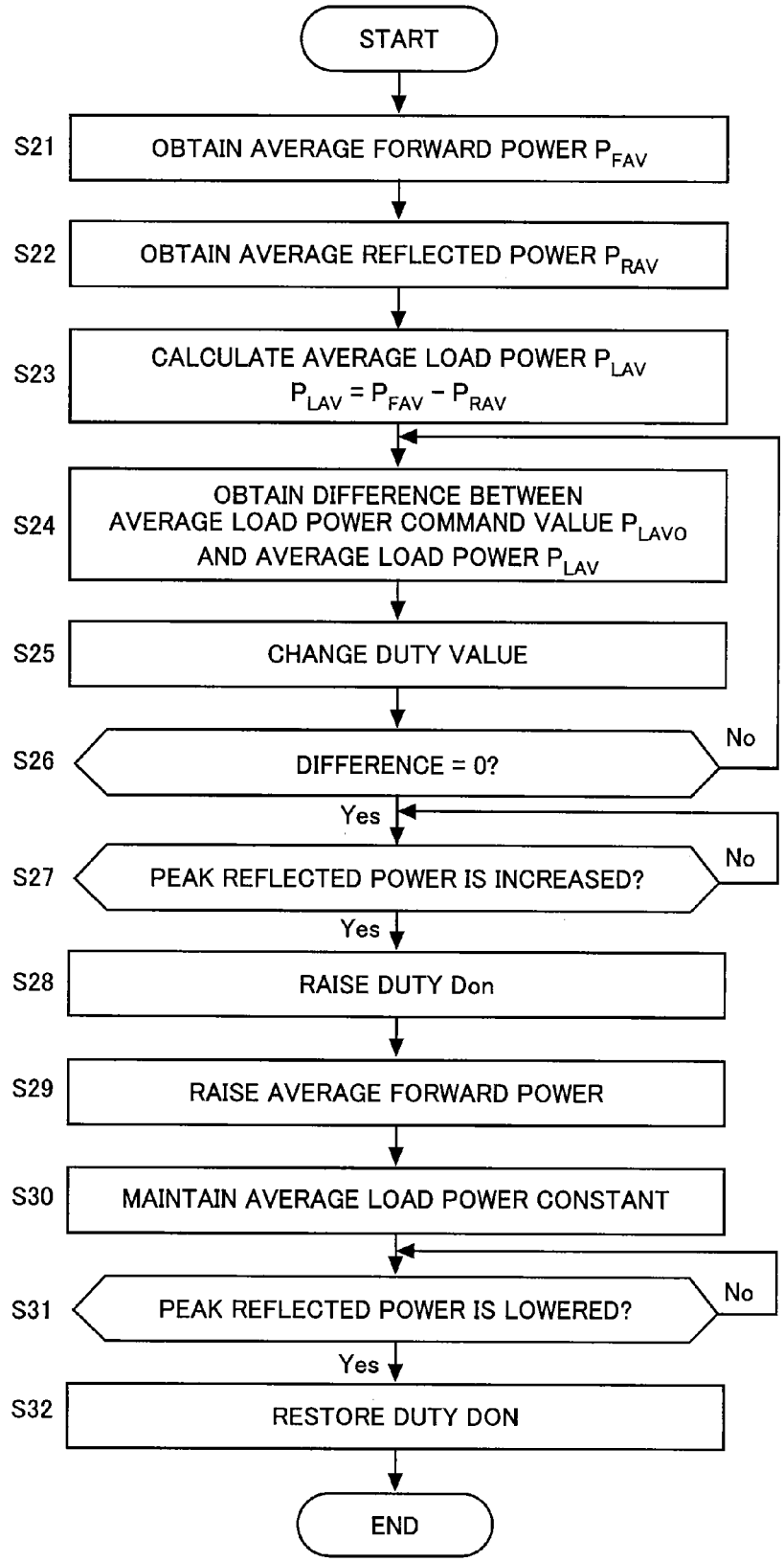
FIG. 14 is a flowchart for explaining an operation example of the load power control in the third embodiment of the present invention.

FIGS. 14, 15, and 16 are a flowchart and signal diagrams for explaining operation examples of the load power control in the case where the peak reflected power is increased.

In the load power control, the duty control is performed so that the average load power becomes equal to an average load power command value.

Average forward power $P_{FAV}$ is obtained in the average processing part 7c1 (S21), and average reflected power $P_{RAV}$ is obtained in the average processing part 7c2 (S22). The average load power detecting part calculates a difference between the obtained average forward power $P_{FAV}$ and average reflected power $P_{RAV}$ to obtain average load power $P_{LAV}$ according the following formula (S23):

$$P_{LAV} = P_{FAV} - P_{RAV}$$

The average load power control part 3C obtains a difference between the average load power $P_{LAV}$ being obtained and the average load power command value $P_{LAVO}$ (S24), modifies the duty value based on this difference value, and performs control so that the difference becomes zero (S26).

By performing the duty control so that the difference between the average load power $P_{LAV}$ and the average load power command value $P_{LAVO}$ becomes zero, it is possible to control the average load power $P_{LAV}$ to become equal to the set value without changing the amplitude value of the peak forward power (S25).

During the operation of the duty control, the reflected power which is detected by the reflected power detecting part 4d3 is obtained so as to monitor the increase of the reflected power. If the reflected power is increased (S27), the duty ratio obtained by the duty control of the average load power control part 3C (ON duty $D_{on}$) is raised (S28), and the average forward power $P_{FAV}$ is also raised (S29). Accordingly, the average load power $P_{LAV}$ is suppressed and kept constant (S30), thereby stabilizing the output of the peak forward power $P_F$.

If the peak reflected power is decreased (S31), the duty ratio having been raised is restored (S32), and a normal duty control is performed.

The signal diagrams as shown in FIG. 15 illustrate that the average load power is suppressed, when the peak reflected power is increased while the duty control is being performed.

Figure 15A:
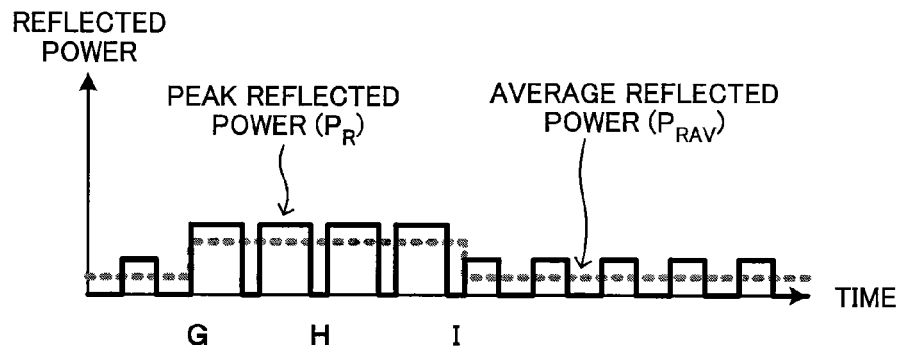
FIG. 15 illustrates signal diagrams for explaining an operation example of the load power control in the third embodiment of the present invention.
Figure 15B:
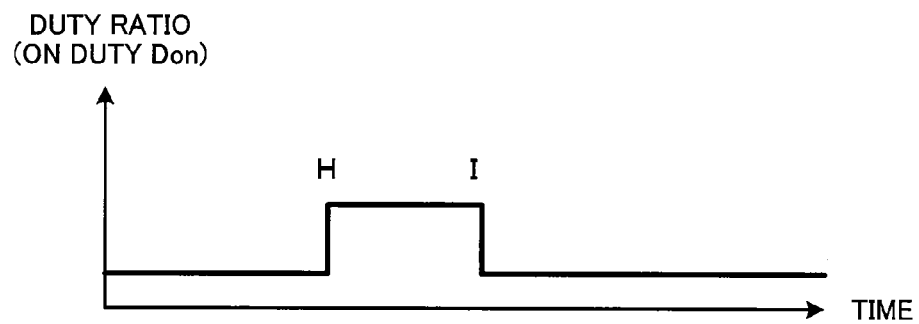
Figure 15C:
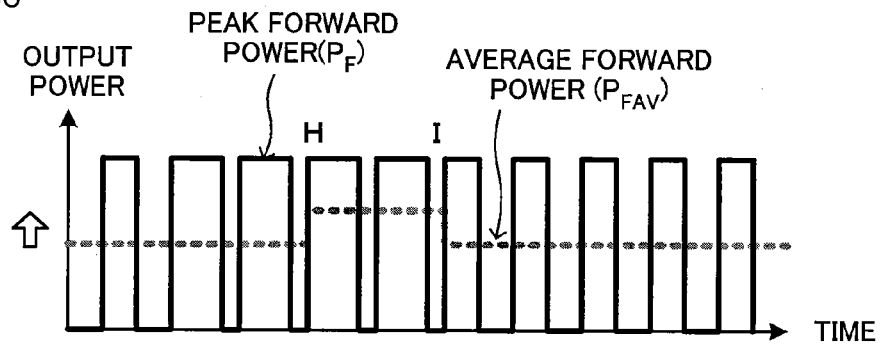
Figure 15D:
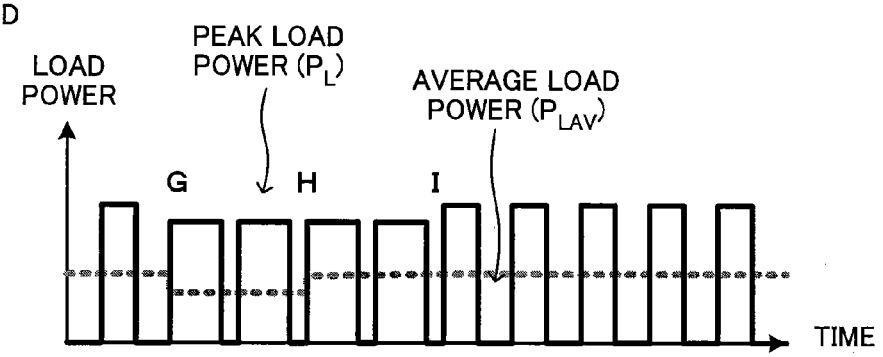

FIG. 15A illustrates the peak reflected power $P_R$ and the average reflected power $P_{RAV}$, FIG. 15B illustrates the duty ratio (ON duty $D_{on}$), FIG. 15C illustrates the peak forward power $P_F$ and the average forward power $P_{FAV}$, and FIG. 15D illustrates the peak load power $P_L$ and the average load power $P_{LAV}$.

When the peak reflected power $P_R$ (indicated by a solid line in FIG. 15A) is increased during the duty control, the average reflected power $P_{RAV}$ is also increased (between the time points G and H in FIG. 15A), whereas the peak load power $P_L$ and the average load power $P_{LAV}$ are decreased (between the time points G and H in FIG. 15D).

Upon detecting the increase of the peak reflected power $P_R$, the average load power control part 3C raises the ON duty $D_{on}$ (time point H in FIG. 15B). By raising the ON duty $D_{on}$, the average forward power $P_{FAV}$ is increased (time point H in FIG. 15C), and then, the average load power $P_{LAV}$ is increased, thereby being restored (time point H in FIG. 15D).

Afterwards, when the increase of the peak reflected power is canceled and then restored, the average reflected power $P_{RAV}$ is also lowered and restored (time point I in FIG. 15A).

When the average load power control part 3C detects the resumption of the peak reflected power $P_R$, it reduces the ON duty $D_{on}$ for restoration (time point I in FIG. 15B). By lowering the ON duty $D_{on}$, the average forward power $P_{FAV}$ is decreased and restored (time point I in FIG. 15C). Since the average forward power $P_{FAV}$ is restored, it is possible to maintain the peak load power $P_L$ and the average load power $P_{LAV}$ to be in the original state in the normal duty control (time point I in FIG. 15D).

FIG. 16 illustrates operation examples of a conventional pulse peak load control. In the pulse peak load control, when the peak reflected power fluctuates, the peak forward power is controlled so as to control the peak load power.

Figure 16A:
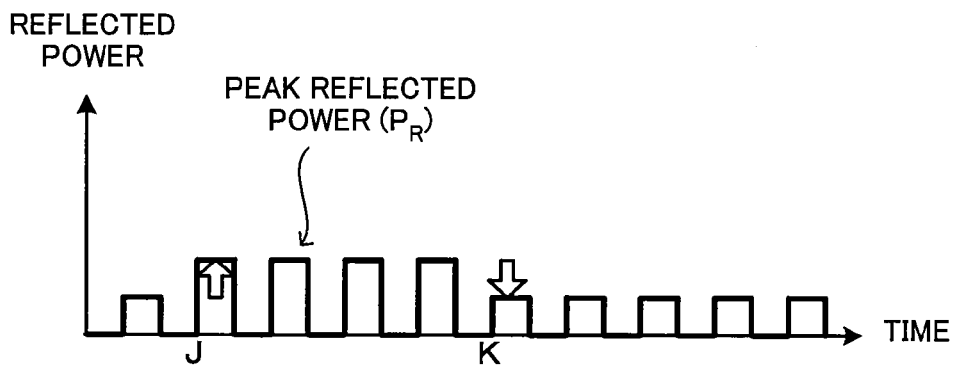
FIG. 16 illustrates signal diagrams for explaining a conventional operation example of the load power control in the third embodiment of the present invention.
Figure 16B:
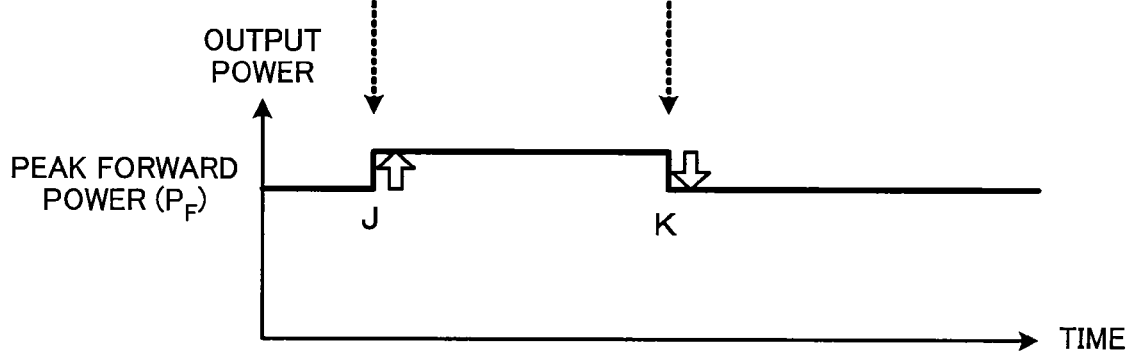
Figure 16C:
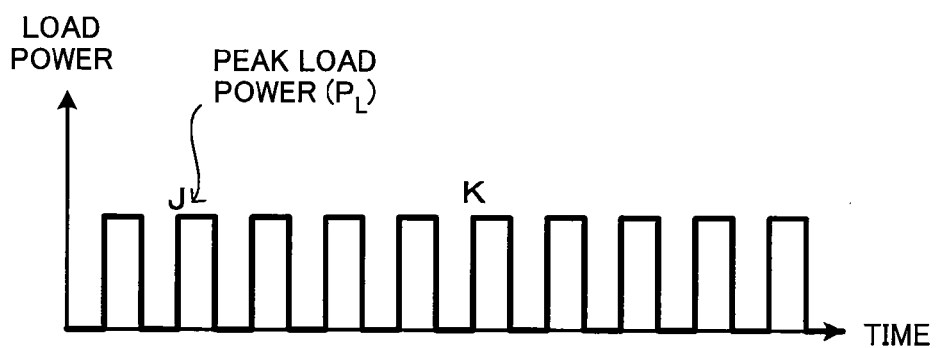

By way of example, when the peak reflected power $P_R$ is increased (time point J in FIG. 16A), the peak forward power $P_F$ is controlled to increase (time point J in FIG. 16B). The peak forward power $P_F$ is controlled to increase so that the peak load power $P_L$ may be kept constant (time point J in FIG. 16C).

When the increase of the peak reflected power $P_R$ is canceled (time point K in FIG. 16A), the peak forward power $P_F$ is controlled to be reduced and restored (time point K in FIG. 16B).

In this pulse peak load control, the peak forward power fluctuates. Therefore, supplying of the peak forward power to the load also fluctuates, and this may cause a fluctuation of plasma density at the load, thereby incurring instability.

On the other hand, according to the duty control of the present invention, it is possible to control the average load power while keeping the peak forward power constant, and avoid an unstable operation due to the fluctuation of the peak forward power.

Fourth Embodiment

Configuration and Control in the Case where Duty Control is Applied to Continuous Forward Power Control Mode Next, as a fourth embodiment of the present invention, a configuration and control operation will be explained with reference to FIG. 17 to FIG. 20, as to the case where the duty control is applied to the continuous forward power control mode.

The duty control step of the present invention may include a pulse output control for producing discontinuous output, and a continuous output control for producing continuous output from a pulse output.

In the pulse output control, the ON period is set to be less than 100% in the duty ratio which is determined by the ON period and OFF period within one cycle of the pulse output, and the average power value of peak forward power is controlled to become smaller than the peak forward power, so that the pulse output is rendered to be a discontinuous output.

On the other hand, in the continuous output control, the OFF period is set to be 0% and the ON period is set to be 100% in the duty ratio which is determined by the ON period and OFF period within one cycle of the pulse output, and the average power value of peak forward power is controlled to be equal to the peak forward power, so that the pulse output is rendered to be a continuous output.

The continuous forward power control mode is a mode for performing the continuous output control over the forward power. In the continuous forward power control mode, when the forward power is supplied to the load in a constant state, such as in the course of a process, if the impedance of the load is changed in such a case that the impedance within the chamber is changed due to a factor including a gas pressure variation and ion reactions within the chamber, there is a possibility that the reflected power is increased temporarily.

The present invention applies the duty control to the continuous forward power control mode as described above, and even when the peak reflected power is increased, the average reflected power is suppressed without changing the peak forward power, unlike a conventional control, thereby supplying the power to the load in a stable manner.

Figure 17:
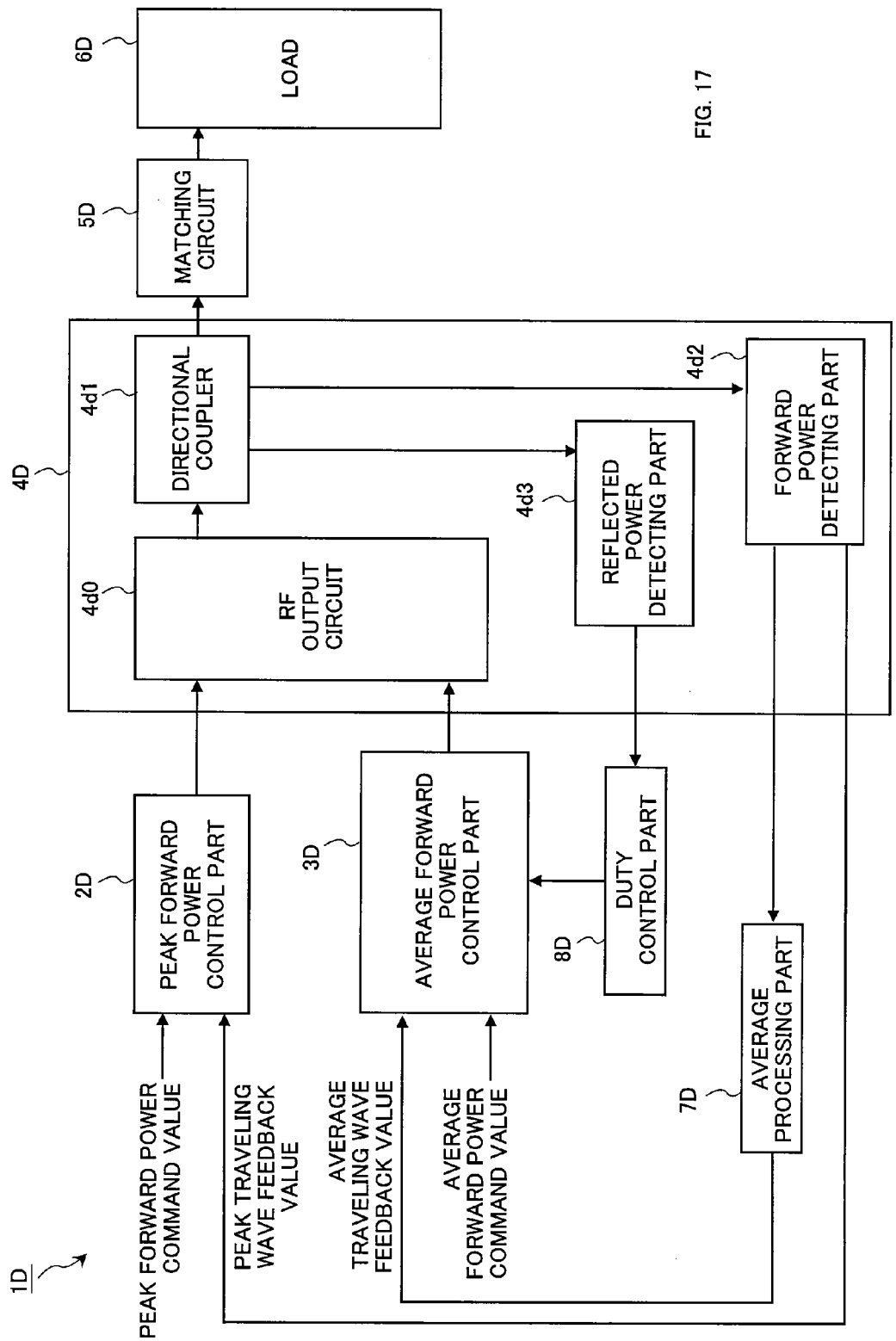
FIG. 17 is a diagram for explaining a configuration example to apply the duty control to a continuous forward power control mode in a fourth embodiment of the present invention.

FIG. 17 illustrates a configuration example when the duty control is applied to the continuous forward power control mode.

In FIG. 17, the configuration of the pulse modulated RF power supply device 1D is almost the same as the configuration as shown in FIG. 9, incorporating a peak forward power control part 2D for controlling an amplitude of peak forward power, an average forward power control part 3D for controlling a duty ratio of a pulse output, an RF output part 4D for outputting an RF output of the pulse output, and an average processing part 7D, and the configuration is further provided with a duty control part 8D for controlling a duty ratio of the duty control which is performed by the average forward power control part 3D.

The RF output part 4D incorporates an RF output circuit 4$d$0, a forward power detecting part 4$d$2 for detecting peak forward power, a reflected power detecting part 4$d$3 for detecting peak reflected power, and a directional coupler 4$d$1 for achieving separation between the peak forward power and the peak reflected power to retrieve the power respectively.

The average processing part 7D obtains average forward power based on the peak forward power being detected by the forward power detecting part 4$d$2, and gives the average forward power being obtained as a feedback to the average forward power control part 3D.

The constitutional elements except the average traveling wave control part 3D for performing the duty control over the average forward power, and the duty control part 8D, are almost the same as the configuration of the pulse modulated RF power supply device 1B as shown in FIG. 9. Therefore, mainly the continuous output control and the duty control operations of the average forward power control part 3D will be explained hereinafter.

The directional coupler 4$d$1 achieves separation between the peak forward power and the peak reflected power, inputs the peak forward power in the forward power detecting part 4$d$2, and inputs the peak reflected power in the reflected power detecting part 4$d$3.

The forward power detecting part 4$d$2 transmits the peak forward power value being detected to the peak forward power control part 2D, and simultaneously transmits the peak forward power being detected to the average processing part 7D. The average processing part 7D transmits the average forward power being obtained to the average forward power control part 3D. The reflected power detecting part 4$d$3 transmits the peak reflected power value being detected to the duty control part 8D, and the duty control part 8D changes the duty ratio of the duty control which is performed in the average forward power control part 3D, in response to the fluctuation of the reflected power.

The average forward power control part 3D compares the average forward power from the average processing part 7D as a feedback value, with the average forward power command value, and performs the duty control so that the average forward power value becomes equal to the average forward power command value.

In the average forward power control part 3D, in a normal state, a continuous output control is performed setting the duty ratio (ON duty $D_{on}$) to 100%. Then, the duty control is adjusted according to the control signal transmitted from the duty control part 8D, and switching is done between the continuous output control and the pulse output control. Here, the continuous output control is a control mode for setting the duty ratio (ON duty $D_{on}$) to 100% in the duty control, and the pulse output control is a control mode for performing the duty control at the duty ratio (ON duty $D_{on}$) being smaller than 100%.

Such duty control adjustment is carried out when the peak reflected power is increased, for instance, by switching the duty ratio (ON duty $D_{on}$) from 100% to a predetermined value smaller than 100%. Accordingly, switching is done from the continuous output control to the pulse output control, thereby suppressing the average reflected power, and the power source is protected. In this duty control adjustment, since the peak forward power $P_F$ is controlled to be constant, a matching operation of the matching circuit becomes stable, thereby stabilizing the power injection into the chamber.

Figure 18:
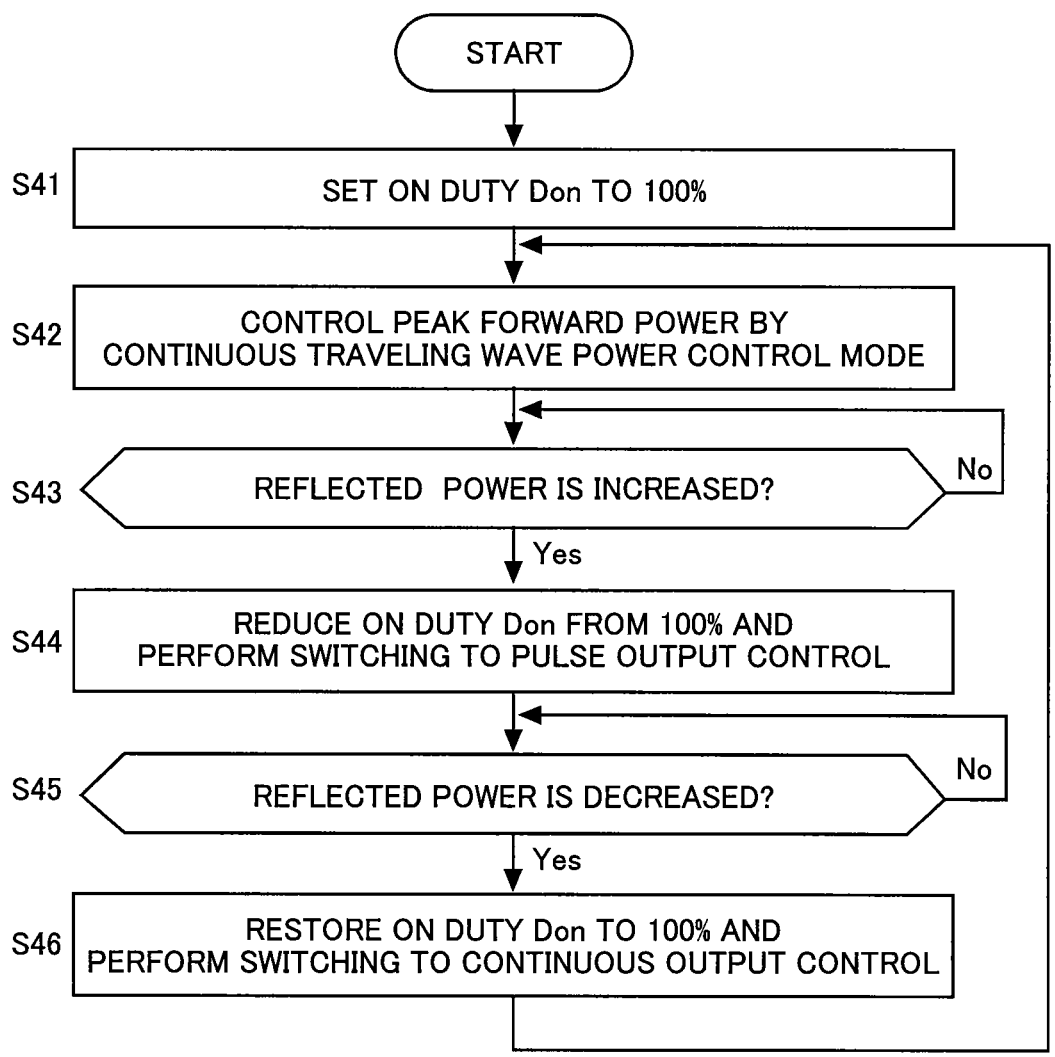
FIG. 18 is a flowchart for explaining a control operation example to apply the duty control to the continuous forward power control mode in the fourth embodiment of the present invention.

FIG. 18, FIG. 19, and FIG. 20 are a flowchart and signal diagrams for explaining operation examples of the traveling wave control in the case where the peak reflected power is increased in the continuous forward power control mode.

In a normal state, the average forward power control part 3D performs the continuous output control so that the average forward power becomes equal to the average forward power command value.

In this control state, the duty ratio (ON duty $D_{on}$) is set to be 100% (S41), and the peak forward power is controlled in the continuous forward power control mode (S42).

In this continuous forward power control mode, the duty control part 8D monitors the peak reflected power which is detected by the reflected power detecting part 4d3. Upon detecting the increase of the peak reflected power (S43), the duty control part 8D performs switching from the continuous output using the duty ratio (ON duty $D_{on}$) of 100% to the pulse output using the duty ratio (ON duty $D_{on}$) being smaller than 100%. Accordingly, it is possible to suppress the average reflected power, while keeping the state that the output of the peak forward power $P_F$ is stabilized (S44).

Upon detecting the decrease of the peak reflected power (S45), the duty control part 8D restores the duty ratio (ON duty $D_{on}$) to 100%, performs switching from the pulse output to the continuous output, and resumes the continuous forward power control mode according to the continuous output (S46).

The signal diagrams shown in FIG. 19 illustrate the switching between the continuous output and the pulse output.

Figure 19A:
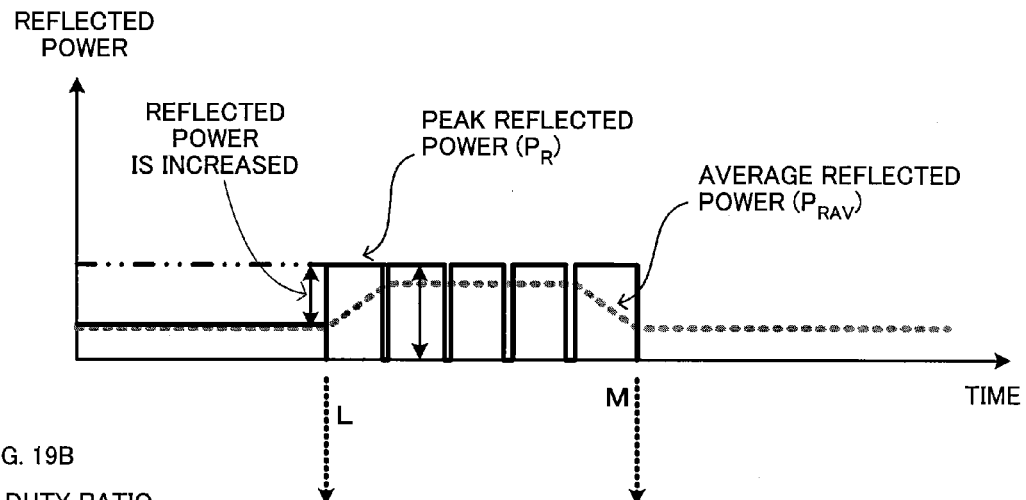
FIG. 19 illustrates signal diagrams for explaining a control operation example to apply the duty control to the continuous forward power control mode in the fourth embodiment of the present invention.
Figure 19B:
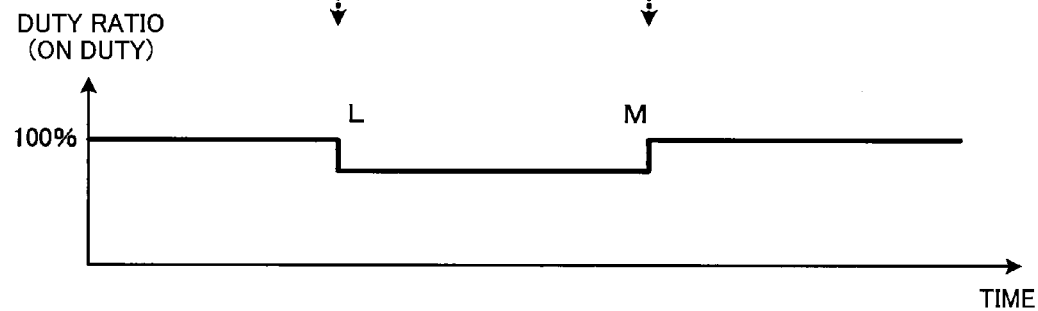
Figure 19C:
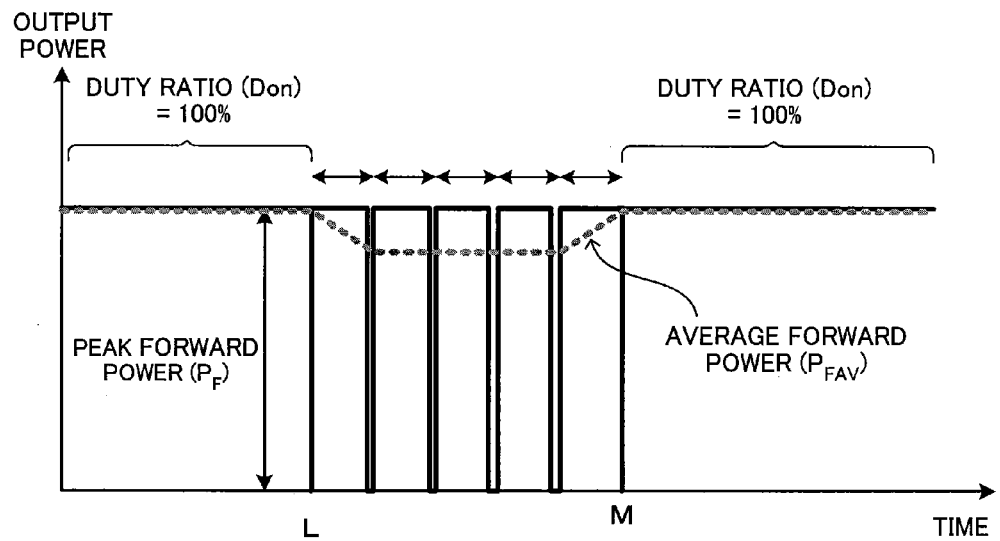

FIG. 19A illustrates the peak reflected power $P_R$ and the average reflected power $P_{RAV}$, FIG. 19B illustrates the duty ratio (ON duty $D_{on}$), and FIG. 19C illustrates the peak forward power $P_F$ and the average forward power $P_{FAV}$.

In the continuous forward power control mode, while the continuous output is performed setting the duty ratio (ON duty $D_{on}$) to 100%, if the peak reflected power $P_R$ (indicated by the solid line in FIG. 19A) is increased, the average reflected power $P_{RAV}$ (indicated by the broken line in FIG. 19A) is also increased (between the time points L and M in FIG. 19A).

Upon detecting the increase of the peak reflected power $P_R$, the duty control part 8D lowers the ON duty $D_{on}$ from 100% (time point L in FIG. 19B). By lowering the ON duty $D_{on}$, the average forward power $P_{FAV}$ is decreased (time point L in FIG. 19C).

Afterwards, when the increase of the peak reflected power $P_R$ is canceled and it is restored, the duty control part 8D detects the decrease of the peak reflected power $P_R$, and restores the ON duty $D_{on}$ to 100% (time point M in FIG. 19B).

By resuming the continuous control with the ON duty $D_{on}$ being 100%, the average forward power $P_{FAV}$ is restored to the original state (point M in FIG. 19C).

According to an embodiment of the control of the present invention, the continuous output control is carried out setting the ON duty $D_{on}$ to 100% in a normal state, and when the peak reflected power is increased, the ON duty $D_{on}$ is set to be smaller than 100% and the pulse output control is performed. Consequently, the average forward power is lowered and the average reflected power is suppressed.

FIG. 20 illustrates an operation example of a conventional continuous output control. In this continuous output control, when the peak reflected power fluctuates, the peak forward power is controlled so as to control the average forward power.

Figure 20A:
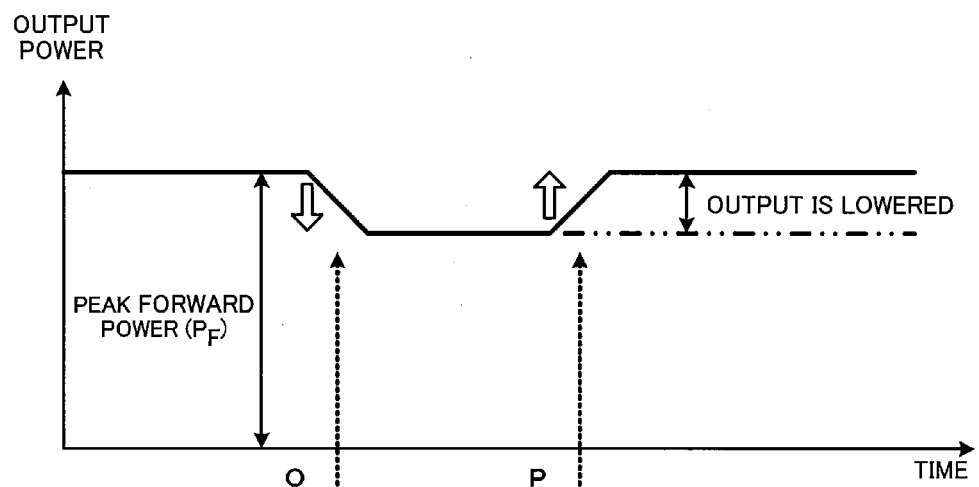
FIG. 20 illustrates signal diagrams for explaining a conventional control operation example of the continuous forward power control mode in the fourth embodiment of the present invention.
Figure 20B:
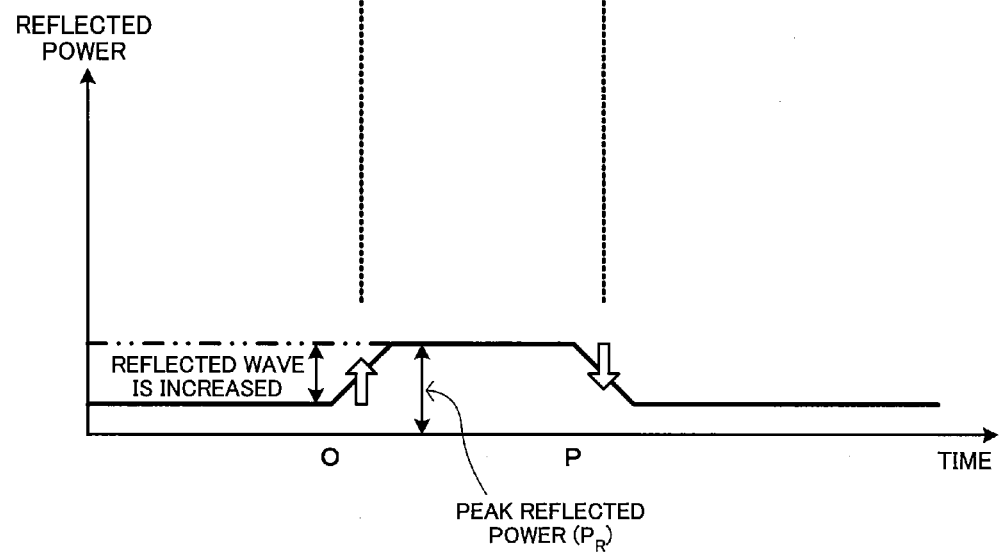

For example, when the peak reflected power $P_R$ is increased (time point O in FIG. 20B), a control is performed in such a manner that the peak forward power $P_F$ is decreased (time point O in FIG. 20A). By decreasing the peak forward power $P_F$, the average forward power is suppressed.

When the increase of the peak reflected power $P_R$ is canceled (time point P in FIG. 20B), a control is performed in such a manner that the peak forward power $P_F$ is increased and restored (time point P in FIG. 20A).

In this continuous output control, since the peak forward power fluctuates, supplying of the peak forward power to the load also fluctuates, and this may cause variation of plasma density at the load with incurring of instability.

On the other hand, according to the control of the present invention, it is possible to control the average forward power while keeping the peak forward power constant, and avoid unstable operations due to the fluctuations of the peak forward power.

Fifth Embodiment

Configuration and Control in the Case where Duty Control is Applied to Continuous Forward Power Control Mode to Increase Peak Forward Power (FIG. 21 to FIG. 24)

Next, as a fifth embodiment of the present invention, a configuration and control operations will be explained with reference to FIG. 21 to FIG. 24, as to the case where the duty control is applied to the continuous forward power control mode to increase the peak forward power.

On the occasion of generating plasma in the chamber on the load side, there is a tendency that reflected power is increased before the ignition of the plasma for starting a process of generating the plasma. In the conventional control method, the forward power is made to droop against the increase of the reflected power, thereby reducing an effect on the RF output power source side. However, in such control as allowing the forward power to droop, there is a problem that the state of the voltage within the chamber being lowered than the plasma ignition voltage may cause a failure of the plasma ignition.

The present embodiment applies the duty control to the continuous forward power control mode, in the same manner as the aforementioned embodiment, and even when the peak reflected power is increased, it is possible to suppress the average reflected power without changing the peak forward power, unlike the conventional control, and supply the power to the load in a stable manner.

A difference between the present embodiment and the aforementioned embodiment is as the following; the aforementioned embodiment relates to power supplying in a normal state for supplying constant peak forward power, whereas the present embodiment relates to power supplying which gradually increases the peak forward power at the time of process start, or the like.

Figure 21:
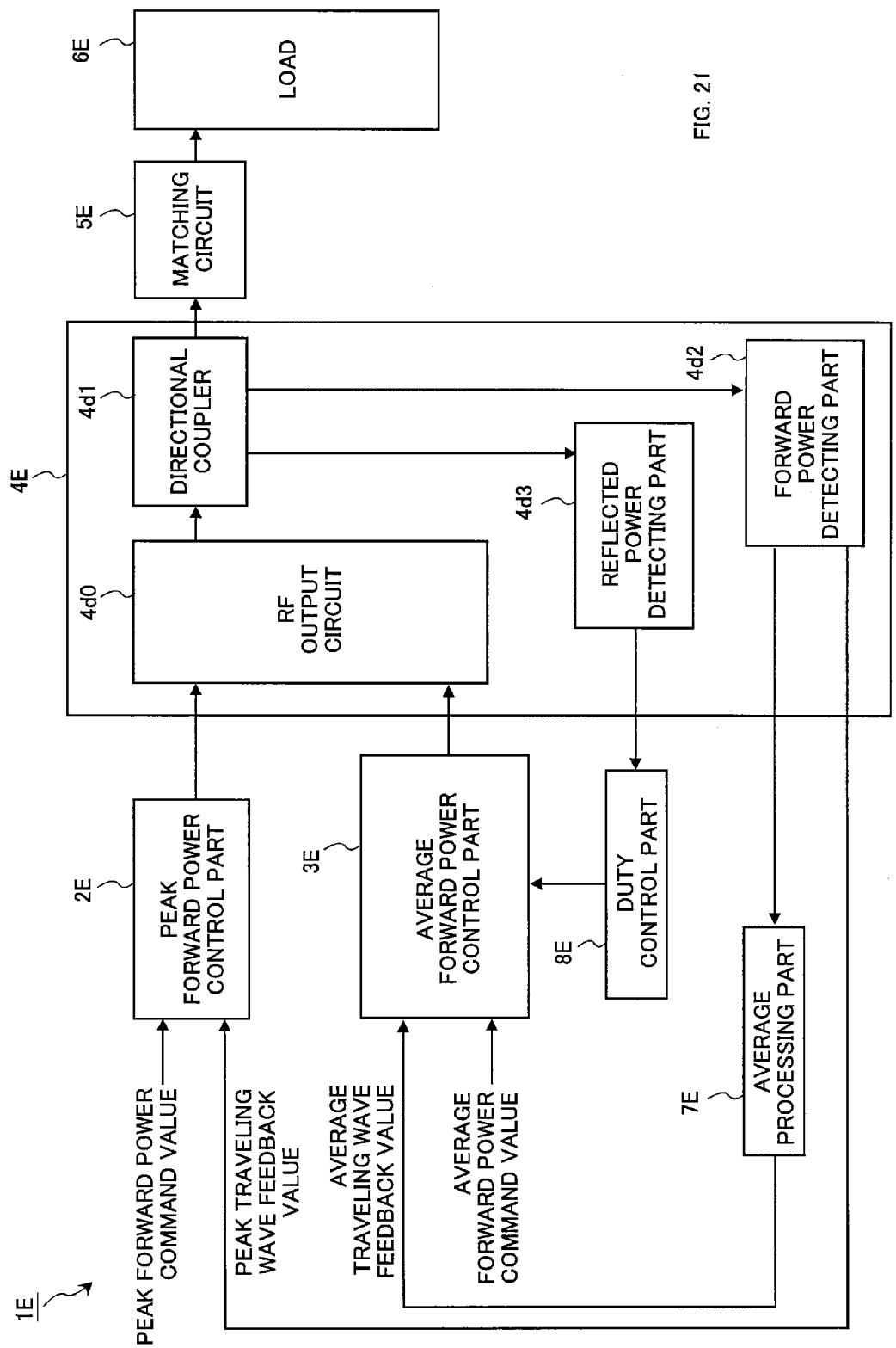
FIG. 21 is a diagram for explaining a configuration example in the case where the duty control is applied to the continuous forward power control mode to increase the peak forward power in a fifth embodiment of the present invention.

FIG. 21 illustrates a configuration example in the case where the duty control is applied to the continuous forward power control mode to increase the peak forward power, and it is possible to configure the present example in the same manner as the configuration example as shown in FIG. 17.

In FIG. 21, the configuration of the pulse modulated RF power supply device 1E incorporates a peak forward power control part 2E for controlling amplitude of the peak forward power, an average forward power control part 3D for controlling a duty ratio of a pulse output, an RF output part 4E for outputting the RF output of the pulse output, and an average processing part 7E, and it is further provided with a duty control part 8E for controlling the duty ratio of the duty control that is performed by the average forward power control part 3E.

The RF output part 4E incorporates an RF output circuit 4d0, a forward power detecting part 4d2, a reflected power detecting part 4d3 for detecting peak reflected power, and a directional coupler 4d1 for achieving separation between the peak forward power and the peak reflected power to retrieve the power respectively.

The average processing part 7E obtains average forward power from the peak forward power being detected by the forward power detecting part 4d2, and gives the average forward power being obtained as a feedback to the average forward power control part 3E.

The directional coupler 4d1 achieves separation between the peak forward power and the peak reflected power, inputs the peak forward power in the forward power detecting part 4d2, and inputs the peak reflected power in the reflected power detecting part 4d3.

The forward power detecting part 4d2 transmits the peak forward power value being detected to the peak forward power control part 2E, and simultaneously transmits the peak forward power being detected to the average processing part 7E. The average processing part 7E transmits the average forward power being obtained to the average forward power control part 3E. The reflected power detecting part 4d3 transmits the peak reflected power value being detected to the duty control part 8E, and the duty control part 8E changes the duty ratio of the duty control which is performed in the average forward power control part 3E in response to the fluctuation of the reflected power, at the time of the process start.

The average forward power control part 3E compares the average forward power value from the average processing part 7E as a feedback value, with the average forward power command value, and performs the duty control so that the average forward power value becomes equal to the average forward power command value.

In the average forward power control part 3E, at the time of process start and in a normal state, the continuous output control is started setting the duty ratio (ON duty $D_{on}$) to 100%, and then, the duty control is adjusted according to the control signal transmitted from the duty control part 8E, whereby switching is done between the continuous output control and the pulse output control. Here, the continuous output control is a control mode for setting the duty ratio (ON duty $D_{on}$) to 100% in the duty control, and the pulse output control is a control mode for performing the duty control at the duty ratio (ON duty $D_{on}$) being smaller than 100%.

Such duty control adjustment is carried out when the peak reflected power is increased, for instance, by switching the duty ratio (ON duty $D_{on}$) from 100% to a predetermined value smaller than 100%. Accordingly, switching is done from the continuous output control to the pulse output control and the average reflected power is suppressed, thereby protecting the power source. In this duty control adjustment, since the peak forward power $P_F$ is controlled to be constant, a matching operation of the matching circuit becomes stable, thereby stabilizing the power injection into the chamber.

Figure 22:
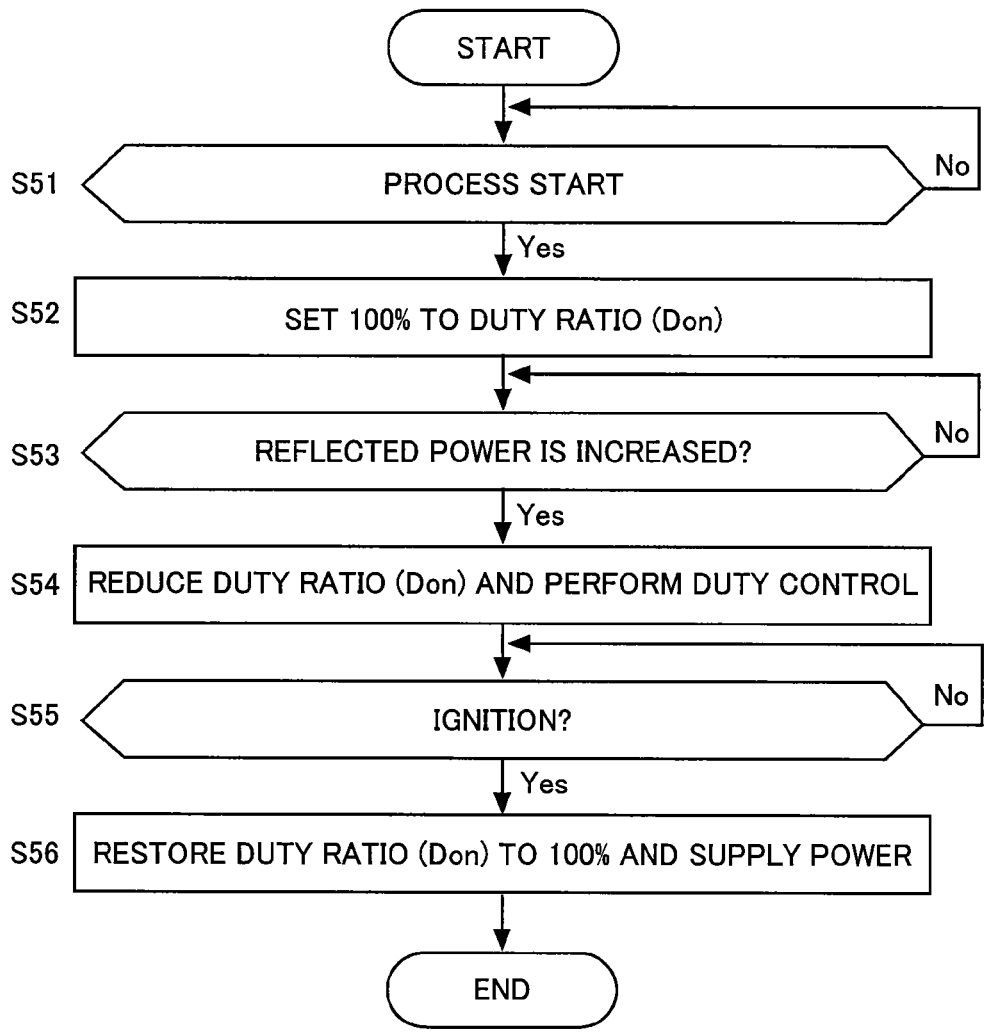
FIG. 22 is a flowchart for explaining a control operation example in the case where the duty control is applied to the continuous forward power control mode to increase the peak forward power in the fifth embodiment of the present invention.

FIG. 22, FIG. 23, and FIG. 24 are a flowchart and signal diagrams for explaining operation examples of the traveling wave control in the case where the peak reflected power is increased at the time of process start in the continuous forward power control mode.

The average forward power control part 3E performs the continuous output control at the time of process start and in a normal state, so that the average forward power is controlled to become equal to the average forward power command value. In the peak forward power control part 2E, at the time of process start, the power is increased from zero to a constant power value at a predetermined increase rate, and the process is started based on the peak forward power command which achieves the constant power value in the normal state (S51).

At the time of process start, the average forward power control part 3E sets the duty ratio (ON duty $D_{on}$) to 100%, and performs the control in the continuous forward power control mode (S52).

In the continuous forward power control mode, the duty control part BE monitors the peak reflected power which is detected by the reflected power detecting part 4d3. Upon detecting the increase of the peak reflected power (S53), the duty control part 8E performs switching from the continuous output at the duty ratio (ON duty $D_{on}$) of 100% to the pulse output at the duty ratio (ON duty $D_{on}$) being smaller than 100%. Accordingly, it is possible to suppress the average reflected power in the state where the output of the peak forward power $P_F$ is stabilized (S54).

Upon detecting ignition or acceptable peak reflected power (S55), the duty control part 8E restores the duty ratio (ON duty $D_{on}$) to 100%, performs switching from the pulse output to the continuous output, and resumes the continuous forward power control mode according to the continuous output (S56). Detection of the ignition can be achieved by detecting a fluctuation of the reflected power, for instance.

The signal diagram as shown in FIG. 23 illustrates the switching between the continuous output and the pulse output at the time of process start.

Figure 23A:
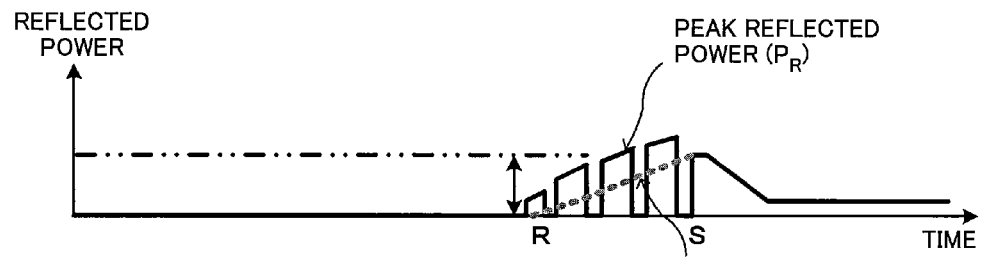
FIG. 23 illustrates signal diagrams for explaining a control operation example in the case where the duty control is applied to the continuous forward power control mode to increase the peak forward power in the fifth embodiment of the present invention.
Figure 23B:
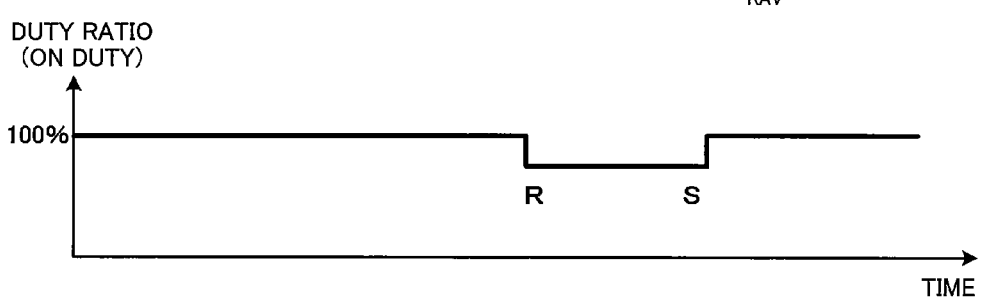
Figure 23C:
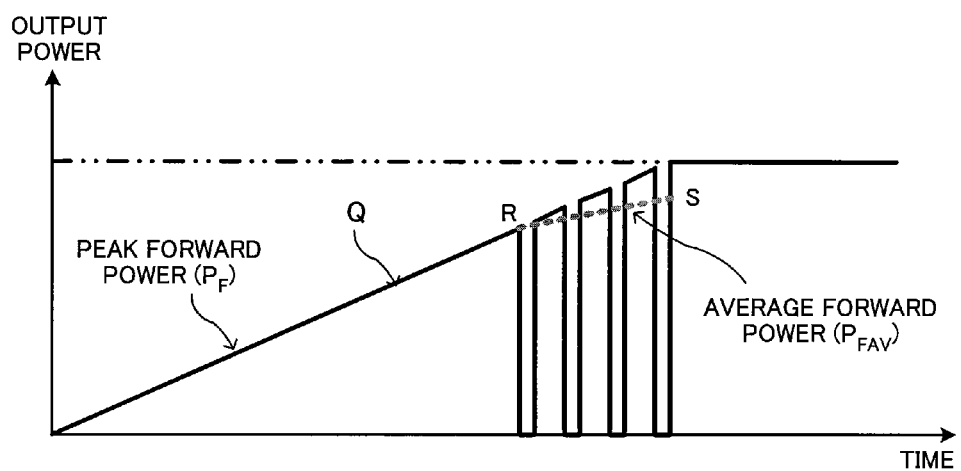

FIG. 23A illustrates the peak reflected power $P_R$ and the average reflected power $P_{RAV}$, FIG. 23B illustrates the duty ratio (ON duty $D_{on}$), and FIG. 23C illustrates the peak forward power $P_F$ and the average forward power $P_{FAV}$.

In the continuous forward power control mode, the continuous output is performed setting the duty ratio (ON duty $D_{on}$) to 100%, and the peak forward power is increased from zero toward a predetermined peak forward power value at the start of process start (Q in FIG. 23C). At this time of process start, if the peak reflected power $P_R$ (indicated by the solid line in FIG. 23A) is increased, the average reflected power $P_{RAV}$ (indicated by the broken line is also increased (time point R in FIG. 23A).

Upon detecting the increase of the peak reflected power $P_R$, the duty control part 8E reduces the ON duty $D_{on}$ from 100% (time point R in FIG. 23B). By reducing the ON duty $D_{on}$, the increase of the average forward power $P_{FAV}$ is suppressed (period R-S in FIG. 23C), and accordingly, the increase of the average reflected power $P_{RAV}$ is also suppressed (period R-S in FIG. 23A).

Afterwards, when the increase of the peak reflected power $P_R$ is canceled and restored, the duty control part 8E detects the decrease of the peak reflected power $P_R$, and restores the ON duty $D_{on}$ to 100% (time point S in FIG. 23B). By resuming the continuous control with the ON duty $D_{on}$ being 100%, the average forward power $P_{FAV}$ becomes the normal state (point S in FIG. 23C).

According to an embodiment of the control of the present invention, the continuous output control is carried out, setting the ON duty $D_{on}$ to 100% at the time of process start, and when the peak reflected power is increased, the ON duty $D_{on}$ is set to be smaller than 100% to perform the pulse output control, thereby lowering the average forward power and suppressing the average reflected power.

FIG. 24 illustrates an operation example of a conventional continuous output control. In this continuous output control, when the peak reflected power fluctuates at the time of process start, the peak forward power is controlled so as to control the average forward power.

Figure 24A:
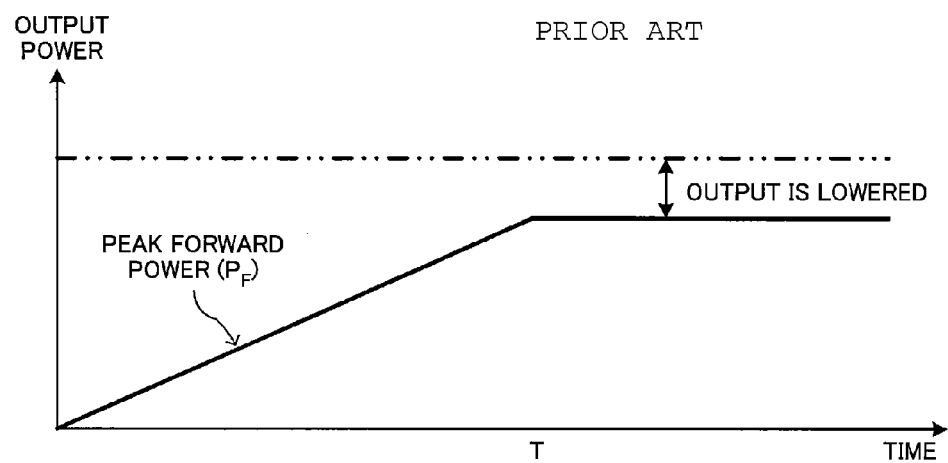
FIG. 24 illustrates signal diagrams for explaining a conventional control operation example in the case where the peak forward power is increased in the continuous forward power control mode in the fifth embodiment of the present invention.
Figure 24B:
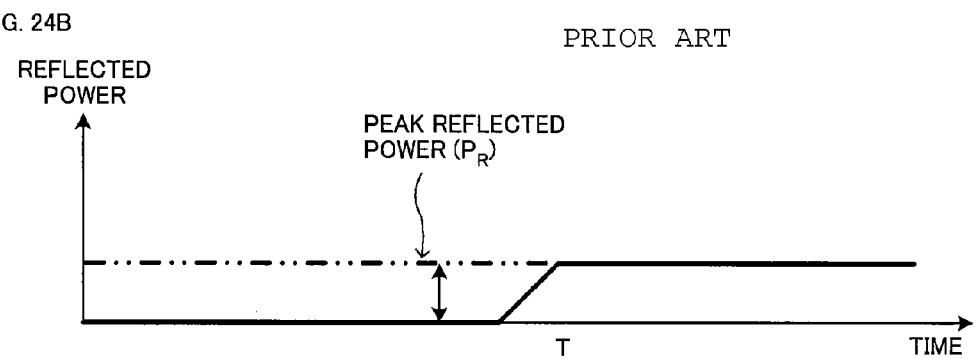

For example, when the peak reflected power $P_R$ is increased (time point T in FIG. 24B), a control is performed so as to lower the peak forward power $P_F$ (time point T in FIG. 24A). Accordingly, the peak forward power $P_F$ is decreased, thereby suppressing the average forward power.

In this continuous output control, since the peak forward power fluctuates, supplying of the peak forward power to the load also fluctuates, and this may cause variation of plasma density at the load with incurring of instability.

On the other hand, according to the control of the present invention, it is possible to control the average forward power while keeping the peak forward power constant, and avoid unstable operations due to the fluctuations of the peak forward power.

Sixth Embodiment

Configuration and Control in the Case where Peak Forward Power is Increased in Duty Control Next, as a sixth embodiment of the present invention, a configuration and control operations will be explained with reference to FIG. 25 and FIG. 26, as to the case where the peak forward power is increased in the duty control.

The embodiment described here is a control mode at the time of process start, which is similar to the aforementioned embodiment. In the aforementioned embodiment, the duty control is applied to the continuous forward power control mode, and when the peak reflected power is increased, the continuous output is switched to the pulse output by the duty control. On the other hand, the present embodiment is a control mode to perform the forward power control so that amplitude of the peak forward power becomes constant, and simultaneously, initiate the process start according to the pulse output, then allowing the duty ratio (ON duty $D_{on}$) to increase, and in a steady state, the duty ratio (ON duty $D_{on}$) is set to be 100% to do switching from the pulse output to the continuous output.

According to this control mode, even when the peak reflected power is increased at the time of process start, the duty ratio (ON Duty $D_{on}$) is in the state being smaller than 100%. Therefore, the average reflected power is suppressed without changing the peak forward power, unlike a conventional control, and supplies power to the load in a stable manner.

Since the configuration of this embodiment may be the same as the fifth configuration example as shown in FIG. 21, it will not be explained tediously.

Figure 25:
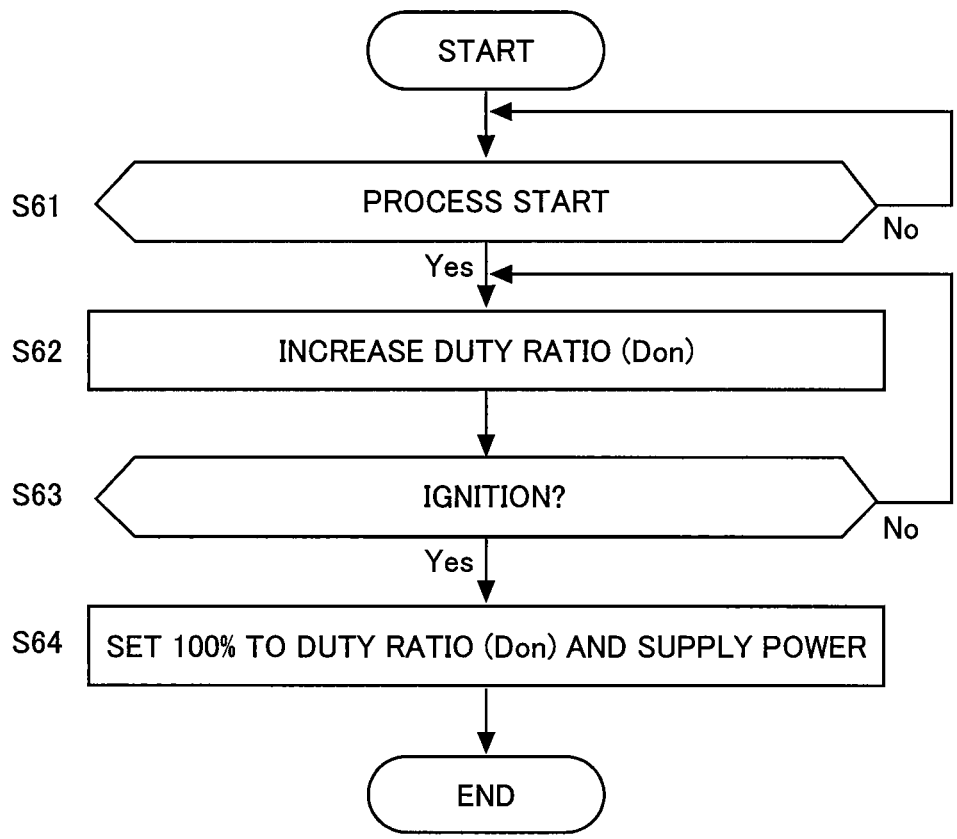
FIG. 25 is a flowchart for explaining the control operation example to increase the peak forward power at the timing such as a process start in the duty control in a sixth embodiment of the present invention.

FIG. 25 and FIG. 26 are a flowchart and signal diagrams for explaining operation examples of the traveling wave control in the case where the peak forward power is increased at the time of process start in the duty control.

The average forward power control part increases the average forward power by the duty control at the time of process start, and controls the power to become predetermined average forward power in a steady state by the duty control. This control can be achieved by a control based on a comparison between the average forward power command value and a feedback value.

In addition, the peak forward power control part subjects an amplitude value of the peak forward power to the constant amplitude control, based on a peak forward power command value having a predetermined size.

At the time of process start (S61), the average forward power control part increases the duty ratio (ON duty $D_{on}$) sequentially from zero to 100% (S62, S63). Plasma is ignited during these steps. In this embodiment, the duty control is performed until the average forward power reaches a power amount of the steady state, thereby suppressing the average forward power supplied to the load. Accordingly the reflected power is also suppressed.

Figure 26A:
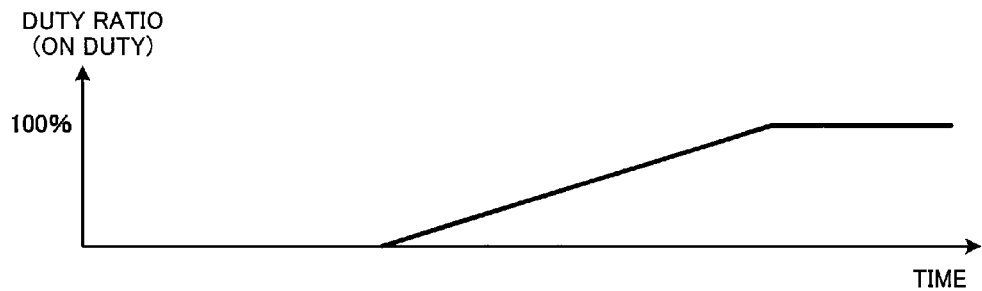
FIG. 26 illustrates signal diagrams for explaining the control operation example to increase the peak forward power at the timing such as the process start in the duty control in the sixth embodiment of the present invention.
Figure 26B:
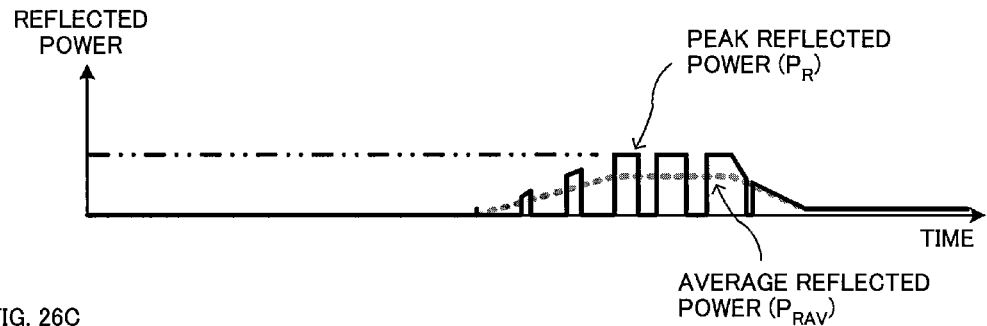
Figure 26C:
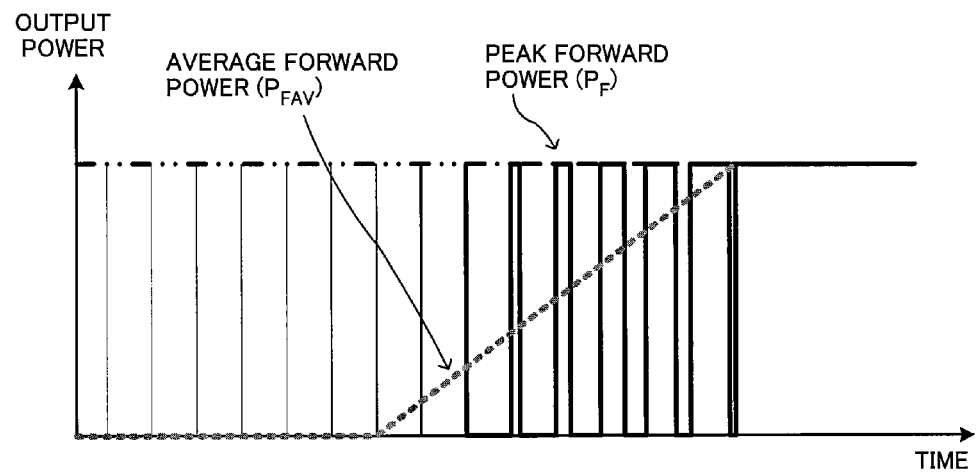
Figure 27A:
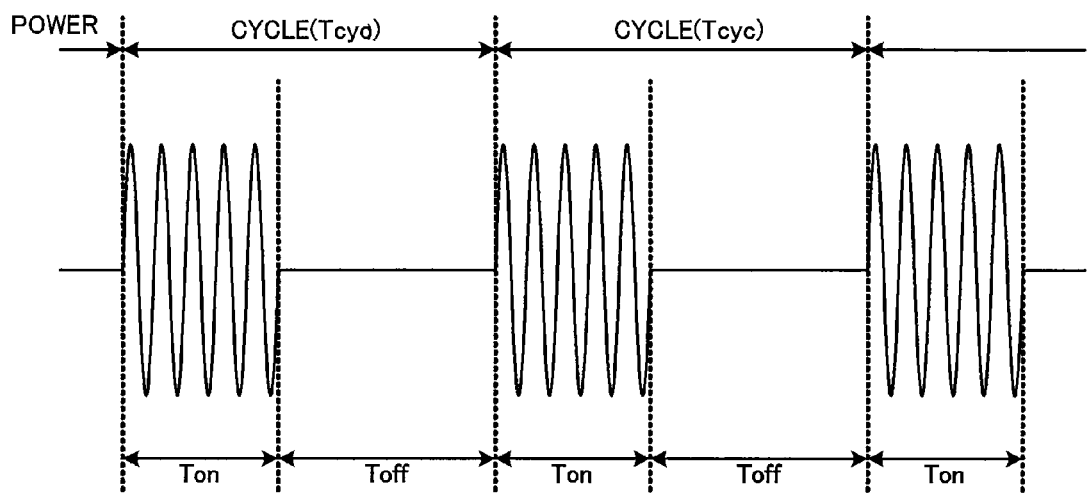
FIG. 27 is a diagram for explaining a pulse output of RF power performed by a pulse modulated RF power control.
Figure 27B:
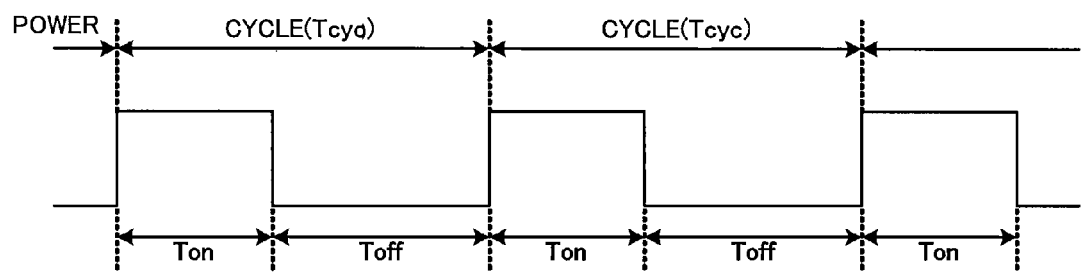

The signal diagram as shown in FIG. 26 illustrates the duty control at the time of process start. FIG. 26A illustrates the duty ratio (ON duty $D_{on}$), FIG. 26B illustrates the peak reflected power $P_R$ and the average reflected power $P_{RAV}$, and FIG. 26C illustrates the peak forward power $P_F$ and the average forward power $P_{FAV}$.

At the time of process start, the duty ratio (ON duty $D_{on}$) is gradually increased from 0% to 100% (FIG. 26A), and the average forward power is increased from zero to a predetermined average forward power value (FIG. 26C).

At the time of process start, when the peak reflected power $P_R$ (indicated by the solid line in FIG. 26B) is increased, the average reflected power $P_{RAV}$ (indicated by the broken line in FIG. 26B) is also increased.

At the time of process start, the average forward power $P_{FAV}$ is already suppressed. Therefore, even when a reflected wave occurs, it is possible to suppress an effect on the RF power source, since the average reflected power $P_{RAV}$ is also suppressed.

It is to be noted that the present invention is not limited to each of the above embodiments. It is understood that many modifications are possible in the exemplary embodiments without materially departing from the teachings and advantages of this invention. Accordingly, all such modifications are intended to be included within the scope of the invention.

The pulse modulated RF power control method and the pulse modulated RF power supply device according to the present invention may be applied to supplying of RF power to the load, in a plasma treatment apparatus for performing plasma etching and plasma CVD, and the like.

What is claimed is:

1. A pulse modulated RF power control method for controlling RF power to be supplied to a load, the RF power being a pulse output which is a RF output outputted intermittently in time wise, the method comprising:
    an output amplitude control step for controlling amplitude of the pulse output,
    a duty control step for controlling a duty ratio of the pulse output, wherein,
    the output amplitude control step performs a constant amplitude control to control an amplitude value of the pulse output so that the amplitude value becomes equal to a set amplitude value, the duty control step performs a constant power control to control the duty ratio of the pulse output so that a power amount determined by the duty ratio becomes equal to a set power value, and the output amplitude control step and the duty control step are operated independently to perform pulse modulation of the RF power, wherein peak forward power is assumed as a control target of the pulse output in the output amplitude control step, average load power is assumed as a control target of the pulse output in the duty control, the output amplitude control step performs the constant amplitude control so that the amplitude value of the peak forward power becomes constant, and the duty control step performs the constant power control so that an average power value of peak load power which is obtained from the peak forward power and peak reflected power determined by the duty ratio, becomes equal to a set power value, thereby controlling the average load power.

2. The pulse modulated RF power control method, according to claim 1, wherein, the output amplitude control step and the duty control step supplying power, voltage or current as a control target of the pulse output to the load.

3. The pulse modulated RF power control method, according to claim 1, wherein, the duty control step includes a step for controlling the duty ratio by setting the RF power of the pulse output to zero during OFF period, and controlling the power amount of the pulse output to be equal to the amplitude value of the pulse output, so as to render the pulse output to be a continuous output.

4. A pulse modulated RF power control method for controlling RF power to be supplied to a load, the RF power being a pulse output which is a RF output outputted intermittently in time wise, the method comprising:

an output amplitude control step for controlling amplitude of the pulse output, a duty control step for controlling a duty ratio of the pulse output, wherein, the output amplitude control step performs a constant amplitude control to control an amplitude value of the pulse output so that the amplitude value becomes equal to a set amplitude value, the duty control step performs a constant power control to control the duty ratio of the pulse output so that a power amount determined by the duty ratio becomes equal to a set power value, and the output amplitude control step and the duty control step are operated independently to perform pulse modulation of the RF power, wherein, peak forward power is assumed as a control target of the pulse output, the output amplitude control step performs the constant amplitude control so that an amplitude value of the peak forward power becomes equal to a set amplitude value, and the duty control step performs the constant power control so that an average power value of the peak forward power determined by the duty ratio becomes equal to a set power value, thereby controlling the peak forward power, wherein, the duty control step comprises:

a pulse output control which sets less than 100% to ON period of the duty ratio determined by the ON period and the OFF period within one cycle of the pulse output, and controls the average power value of the peak forward power to be smaller than the amplitude value of the peak forward power, so that the pulse output is rendered to be a discontinuous output, and a continuous output control which sets 0% to the OFF period and 100% to the ON period of the duty ratio determined by the ON period and the OFF period within one cycle of the pulse output, and controls the average power value of the peak forward power to become equal to the amplitude value of the peak forward power, so that the pulse output is rendered to be a continuous output.

5. The pulse modulated RF power control method, according to claim 4, wherein, in the continuous output control, when an amplitude value of peak reflected power is excessive, the proportion of the ON period of the duty ratio is reduced from 100%, and the continuous output control is switched to the pulse output control, thereby suppressing increase of average reflected power.

6. The pulse modulated RF power control method, according to claim 4, wherein, during the period when the peak forward power is increased by the continuous output control, when an amplitude value of peak reflected power is excessive, the proportion of the ON period of the duty ratio is reduced from 100%, and the continuous output control is switched to the pulse output control, and after the peak forward power is increased, the proportion of the ON period of the duty ratio is restored to 100%, and the pulse output control is switched to the continuous output control, thereby suppressing increase of average reflected power during the period when the peak forward power is increased.

7. The pulse modulated RF power control method, according to claim 1, wherein, the duty control step increases or decreases the duty ratio of the pulse output, based on a feedback value obtained by the constant power control in the output amplitude control step.

8. A pulse modulated RF power control method for controlling RF power to be supplied to a load, the RF power being a pulse output which is a RF output outputted intermittently in time wise, the method comprising:

an output amplitude control step for controlling amplitude of the pulse output, a duty control step for controlling a duty ratio of the pulse output, wherein, the output amplitude control step performs a constant amplitude control to control an amplitude value of the pulse output so that the amplitude value becomes equal to a set amplitude value, the duty control step performs a constant power control to control the duty ratio of the pulse output so that a power amount determined by the duty ratio becomes equal to a set power value, and the output amplitude control step and the duty control step are operated independently to perform pulse modulation of the RF power, wherein, peak forward power is assumed as a control target of the pulse output, the output amplitude control step performs the constant amplitude control so that an amplitude value of the peak forward power becomes equal to a set amplitude value, and the duty control step performs the constant power control so that an average power value of the peak forward power determined by the duty ratio becomes equal to a set power value, thereby controlling the peak forward power, wherein, in controlling the peak forward power assuming the peak forward power as the control target of the pulse output, the duty control step gives a peak reflected power value as a feedback, and suppresses increase of average reflected power by reducing the proportion of the ON period of the duty ratio, when the peak reflected power is increased.

9. The pulse modulated RF power control method, according to claim 1, wherein, in controlling load power assuming the peak forward power and the average load power as the control targets of the pulse output, the duty control step gives the peak reflected power as a feedback, and controls the average load power to be constant by enlarging the proportion of the ON period of the duty ratio, when the peak reflected power is increased.

10. The pulse modulated RF power control method, according to claim 3, wherein, in the continuous output control, when an amplitude value of peak reflected power is excessive, the proportion of the ON period of the duty ratio is reduced from 100%, and the continuous output control is switched to the pulse output control, thereby suppressing increase of average reflected power.

11. The pulse modulated RF power control method, according to claim 3, wherein, during the period when the peak forward power is increased by the continuous output control, when an amplitude value of peak reflected power is excessive, the proportion of the ON period of the duty ratio is reduced from 100%, and the continuous output control is switched to the pulse output control, and after the peak forward power is increased, the proportion of the ON period of the duty ratio is restored to 100%, and the pulse output control is switched to the continuous output control, thereby suppressing increase of average reflected power during the period when the peak forward power is increased.

12. A pulse modulated RF power control method for controlling RF power to be supplied to a load, the RF power being a pulse output which is a RF output outputted intermittently in time wise, the method comprising:

an output amplitude control step for controlling amplitude of the pulse output, a duty control step for controlling a duty ratio of the pulse output, wherein, the output amplitude control step performs a constant amplitude control to control an amplitude value of the pulse output so that the amplitude value becomes equal to a set amplitude value, the duty control step performs a constant power control to control the duty ratio of the pulse output so that a power amount determined by the duty ratio becomes equal to a set power value, and the output amplitude control step and the duty control step are operated independently to perform pulse modulation of the RF power, wherein, peak forward power is assumed as a control target of the pulse output, the output amplitude control step performs the constant amplitude control so that an amplitude value of the peak forward power becomes equal to a set amplitude value, and the duty control step performs the constant power control so that an average power value of the peak forward power determined by the duty ratio becomes equal to a set power value, thereby controlling the peak forward power, wherein, during the period when the peak forward power is increased by the duty control, increase of average reflected power is suppressed by gradually increasing the proportion of the ON period of the duty ratio.

13. The pulse modulated RF power control method, according to claim 1, wherein, in the duty control, a power value of the pulse output during the OFF period is assumed as zero, and a power value of the pulse output during the ON period is assumed as a set power value.

14. A pulse modulated RF power control method for controlling RF power to be supplied to a load, the RF power being a pulse output which is a RF output outputted intermittently in time wise, the method comprising:

an output amplitude control step for controlling amplitude of the pulse output, a duty control step for controlling a duty ratio of the pulse output, wherein, the output amplitude control step performs a constant amplitude control to control an amplitude value of the pulse output so that the amplitude value becomes equal to a set amplitude value, the duty control step performs a constant power control to control the duty ratio of the pulse output so that a power amount determined by the duty ratio becomes equal to a set power value, and the output amplitude control step and the duty control step are operated independently to perform pulse modulation of the RF power, wherein, in the duty control, a power value of the pulse output during the OFF period is assumed as a predetermined power value defined between zero and a set power value, and a power value of the pulse output during the ON period is assumed as the set power value.

15. The pulse modulated RF power control method, according to claim 1, wherein, in the duty control, a frequency is kept constant and a ratio of duration between ON period duration and OFF period duration is controlled.

16. A pulse modulated RF power control method for controlling RF power to be supplied to a load, the RF power being a pulse output which is a RF output outputted intermittently in time wise, the method comprising:

an output amplitude control step for controlling amplitude of the pulse output, a duty control step for controlling a duty ratio of the pulse output, wherein, the output amplitude control step performs a constant amplitude control to control an amplitude value of the pulse output so that the amplitude value becomes equal to a set amplitude value, the duty control step performs a constant power control to control the duty ratio of the pulse output so that a power amount determined by the duty ratio becomes equal to a set power value, and the output amplitude control step and the duty control step are operated independently to perform pulse modulation of the RF power, wherein, in the duty control, OFF period duration varies while ON period duration is kept constant, or the ON period duration varies while the OFF period duration is kept constant, thereby controlling the frequency of the pulse output.

17. A pulse modulated RF power supply device for supplying RF power to a load, comprising:
  an RF output part for outputting an RF output of a pulse output,
  an output amplitude control part for controlling amplitude of the pulse output,
  a duty control part for controlling a duty ratio of the pulse output, wherein,
  the output amplitude control part performs a constant amplitude control to control an amplitude value of the pulse output so that the amplitude value becomes equal to a set amplitude value,
  the duty control part performs a constant power control to control the duty ratio of the pulse output so that a power amount determined by the duty ratio becomes equal to a set power value, and
  the output amplitude control part and the duty control part independently operate the RF output part to perform pulse modulation of the RF power, wherein,
  peak forward power is assumed as a control target of the pulse output in the output amplitude control part,
  average load power is assumed as a control target of the pulse output in the duty control part,
  the output amplitude control part performs the constant amplitude control so that an amplitude value of the peak forward power becomes constant, and
  the duty control part performs the constant power control so that an average power value of peak load power which is obtained from the peak forward power and peak reflected power determined by the duty ratio, becomes equal to a set power value, thereby controlling the average load power.

18. The pulse modulated RF power supply device, according to claim 17, wherein,
  the output amplitude control part and the duty control part supplying power, voltage or current as a control target of the pulse output to the load.

19. A pulse modulated RF power supply device for supplying RF power to a load, comprising:
  an RF output part for outputting an RF output of a pulse output,
  an output amplitude control part for controlling amplitude of the pulse output,
  a duty control part for controlling a duty ratio of the pulse output, wherein,
  the output amplitude control part performs a constant amplitude control to control an amplitude value of the pulse output so that the amplitude value becomes equal to a set amplitude value,
  the duty control part performs a constant power control to control the duty ratio of the pulse output so that a power amount determined by the duty ratio becomes equal to a set power value, and
  the output amplitude control part and the duty control part independently operate the RF output part to perform pulse modulation of the RF power, wherein,
  peak forward power is assumed as a control target of the pulse output,
  the output amplitude control part performs the constant amplitude control so that an amplitude value of the peak forward power becomes equal to a set amplitude value,
  the duty control part performs the constant power control so that an average power value of the peak forward power determined by the duty ratio becomes equal to a set power value, thereby controlling the peak forward power, wherein,
  the duty control part enables switching between a pulse output control determined by the ON period, which is set to be less than 100% of the duty ratio, and the OFF period within one cycle of the pulse output, and controls the average power value of the peak forward power to be smaller than the amplitude value of the peak forward power, so that the pulse output is rendered to be a discontinuous output, and
  a continuous output control which sets the OFF period to be 0% and the ON period to be 100% of the duty ratio determined by the ON period and the OFF period within one cycle of the pulse output, and controls the average power value of the peak forward power to become equal to the amplitude value of the peak forward power, so that the pulse output is rendered to be a continuous output.

20. The pulse modulated RF power supply device, according to claim 17, wherein,
  the duty control part increases or decreases the duty ratio obtained by the constant power control, based on a feedback value of the pulse output.

21. A pulse modulated RF power supply device for supplying RF power to a load, comprising:
  an RF output part for outputting an RF output of a pulse output,
  an output amplitude control part for controlling amplitude of the pulse output,
  a duty control part for controlling a duty ratio of the pulse output, wherein,
  the output amplitude control part performs a constant amplitude control to control an amplitude value of the pulse output so that the amplitude value becomes equal to a set amplitude value,
  the duty control part performs a constant power control to control the duty ratio of the pulse output so that a power amount determined by the duty ratio becomes equal to a set power value, and
  the output amplitude control part and the duty control part independently operate the RF output part to perform pulse modulation of the RF power, wherein,
  peak forward power is assumed as a control target of the pulse output,
  the output amplitude control part performs the constant amplitude control so that an amplitude value of the peak forward power becomes equal to a set amplitude value,
  the duty control part performs the constant power control so that an average power value of the peak forward power determined by the duty ratio becomes equal to a set power value, thereby controlling the peak forward power, wherein,
  in controlling the peak forward power assuming the peak forward power as the control target of the pulse output,
  the duty control part gives a reflected power value as a feedback, and suppresses increase of average reflected power by reducing the proportion of the ON period of the duty ratio, when the reflected power is increased.

22. The pulse modulated RF power supply device, according to claim 17, wherein,
  in controlling load power assuming the peak forward power and the average load power as the control targets of the pulse output,
  the duty control part gives the peak reflected power as a feedback, and controls the average load power to be constant by enlarging the proportion of the ON period of the duty ratio, when the peak reflected power is increased.

23. A pulse modulated RF power supply device for supplying RF power to a load, comprising:

an RF output part for outputting an RF output of a pulse output, an output amplitude control part for controlling amplitude of the pulse output, a duty control part for controlling a duty ratio of the pulse output, wherein, the output amplitude control part performs a constant amplitude control to control an amplitude value of the pulse output so that the amplitude value becomes equal to a set amplitude value, the duty control part performs a constant power control to control the duty ratio of the pulse output so that a power amount determined by the duty ratio becomes equal to a set power value, and the output amplitude control part and the duty control part independently operate the RF output part to perform pulse modulation of the RF power, wherein, the duty control part controls the duty ratio by setting the RF power of the pulse output to zero during OFF period, controls the power amount of the pulse output to become equal to the amplitude value of the pulse output, so as to render the pulse output to be a continuous output, wherein, in the continuous output control, when an amplitude value of peak reflected power is excessive, the duty control part reduces the proportion of the ON period of the duty ratio from 100%, and performs switching from the continuous output control to the pulse output control, thereby suppressing increase of average reflected power.

24. A pulse modulated RF power supply device for supplying RF power to a load, comprising:

an RF output part for outputting an RF output of a pulse output, an output amplitude control part for controlling amplitude of the pulse output, a duty control part for controlling a duty ratio of the pulse output, wherein, the output amplitude control part performs a constant amplitude control to control an amplitude value of the pulse output so that the amplitude value becomes equal to a set amplitude value, the duty control part performs a constant power control to control the duty ratio of the pulse output so that a power amount determined by the duty ratio becomes equal to a set power value, and the output amplitude control part and the duty control part independently operate the RF output part to perform pulse modulation of the RF power, wherein, the duty control part controls the duty ratio by setting the RF power of the pulse output to zero during OFF period, controls the power amount of the pulse output to become equal to the amplitude value of the pulse output, so as to render the pulse output to be a continuous output, wherein, during the period when the peak forward power is increased by the continuous output control, when an amplitude value of peak reflected power is excessive, the duty control part reduces the proportion of the ON period of the duty ratio from 100%, and performs switching from the continuous output control to the pulse output control, and after the peak forward power is increased, the duty control part restores the proportion of the ON period of the duty ratio to 100%, and performs switching from the pulse output control to the continuous output control, thereby suppressing increase of average reflected power during the period when the peak forward power is increased.

25. A pulse modulated RF power supply device for supplying RF power to a load, comprising:

an RF output part for outputting an RF output of a pulse output, an output amplitude control part for controlling amplitude of the pulse output, a duty control part for controlling a duty ratio of the pulse output, wherein, the output amplitude control part performs a constant amplitude control to control an amplitude value of the pulse output so that the amplitude value becomes equal to a set amplitude value, the duty control part performs a constant power control to control the duty ratio of the pulse output so that a power amount determined by the duty ratio becomes equal to a set power value, and the output amplitude control part and the duty control part independently operate the RF output part to perform pulse modulation of the RF power, wherein, peak forward power is assumed as a control target of the pulse output, the output amplitude control part performs the constant amplitude control so that an amplitude value of the peak forward power becomes equal to a set amplitude value, the duty control part performs the constant power control so that an average power value of the peak forward power determined by the duty ratio becomes equal to a set power value, thereby controlling the peak forward power, wherein, during the period when the peak forward power is increased by the duty control, the duty control part suppresses increase of average reflected power by gradually increasing the proportion of the ON period of the duty ratio.

26. A pulse modulated RF power supply device for supplying RF power to a load, comprising:

an RF output part for outputting an RF output of a pulse output, an output amplitude control part for controlling amplitude of the pulse output a duty control part for controlling a duty ratio of the pulse output, wherein, the output amplitude control part performs a constant amplitude control to control an amplitude value of the pulse output so that the amplitude value becomes equal to a set amplitude value, the duty control part performs a constant power control to control the duty ratio of the pulse output so that a power amount determined by the duty ratio becomes equal to a set power value, and the output amplitude control part and the duty control part independently operate the RF output part to perform pulse modulation of the RF power, wherein, the duty control part assumes a power value of the pulse output during the OFF period as zero, and assumes a power value of the pulse output during the ON period as a set power value.

27. A pulse modulated RF power supply device for supplying RF power to a load, comprising:

an RF output part for outputting an RF output of a pulse output, an output amplitude control part for controlling amplitude of the pulse output, a duty control part for controlling a duty ratio of the pulse output, wherein, the output amplitude control part performs a constant amplitude control to control an amplitude value of the pulse output so that the amplitude value becomes equal to a set amplitude value, the duty control part performs a constant power control to control the duty ratio of the pulse output so that a power amount determined by the duty ratio becomes equal to a set power value, and the output amplitude control part and the duty control part independently operate the RF output part to perform pulse modulation of the RF power, wherein, the duty control part assumes a power value of the pulse output during the OFF period as a predetermined power value defined between zero and a set power value, and assumes a power value of the pulse output during the ON period as the set power value.

28. The pulse modulated RF power supply device, according to claim 17, wherein, the duty control part keeps a frequency constant and controls a ratio of duration between ON period duration and OFF period duration.

29. A pulse modulated RF power supply device for supplying RF power to a load, comprising:

an RF output part for outputting an RF output of a pulse output, an output amplitude control part for controlling amplitude of the pulse output, a duty control part for controlling a duty ratio of the pulse output, wherein, the output amplitude control part performs a constant amplitude control to control an amplitude value of the pulse output so that the amplitude value becomes equal to a set amplitude value, the duty control part performs a constant power control to control the duty ratio of the pulse output so that a power amount determined by the duty ratio becomes equal to a set power value, and the output amplitude control part and the duty control part independently operate the RF output part to perform pulse modulation of the RF power, wherein, the duty control part varies the OFF period duration while keeping the ON period duration constant, or varies the ON period duration while keeping the OFF period duration constant, thereby controlling the frequency of the pulse output.

30. The pulse modulated RF power supply device, according to claim 19, wherein, in the continuous output control, when an amplitude value of peak reflected power is excessive, the duty control part reduces the proportion of the ON period of the duty ratio from 100%, and performs switching from the continuous output control to the pulse output control, thereby suppressing increase of average reflected power.

31. The pulse modulated RF power supply device, according to claim 19, wherein, during the period when the peak forward power is increased by the continuous output control, when an amplitude value of peak reflected power is excessive, the duty control part reduces the proportion of the ON period of the duty ratio from 100%, and performs switching from the continuous output control to the pulse output control, and after the peak forward power is increased, the duty control part restores the proportion of the ON period of the duty ratio to 100%, and performs switching from the pulse output control to the continuous output control, thereby suppressing increase of average reflected power during the period when the peak forward power is increased.

* * * * *